US012777761B2

(12) United States Patent
Check et al.

(10) Patent No.: US 12,777,761 B2
(45) Date of Patent: Oct. 27, 2026

(54) LIGHT-EMITTING DIODE CHIP STRUCTURES

(71) Applicant: CreeLED, Inc., Durham, NC (US)

(72) Inventors: Michael Check, Holly Springs, NC (US); Steven Wuester, Wake Forest, NC (US); Seth Joseph Balkey, Durham, NC (US); Nikolas Hall, Durham, NC (US)

(73) Assignee: CreeLED, Inc., Durham, NC (US)

(*) Notice: Subject to any disclaimer, the term of this patent is extended or adjusted under 35 U.S.C. 154(b) by 705 days.

(21) Appl. No.: 17/822,339

(22) Filed: Aug. 25, 2022

(65) Prior Publication Data

US 2024/0072099 A1 Feb. 29, 2024

(51) Int. Cl.
*H01L 27/15* (2006.01)
*H10H 29/14* (2025.01)

(52) U.S. Cl.
CPC .................................. *H10H 29/142* (2025.01)

(58) Field of Classification Search
CPC ............... H10H 29/142; H10H 20/835; H10H 20/8312; H10H 20/8316
See application file for complete search history.

(56) References Cited

U.S. PATENT DOCUMENTS 10,879,441 B2 * 12/2020 Check .................... H10H 20/81
10,985,294 B2 * 4/2021 White .................. H10H 20/831
11,916,165 B2 * 2/2024 Haberern ............. H10H 20/835
2003/0025212 A1 * 2/2003 Bhat .................... H10H 20/819 257/E33.068
2008/0246047 A1 * 10/2008 Hsu ...................... H10H 20/841 257/E33.068
2009/0283787 A1 * 11/2009 Donofrio ............. H10H 20/857 257/E33.068

(Continued)

FOREIGN PATENT DOCUMENTS

JP 2014011275 A 1/2014
JP 2014044971 A 3/2014
TW 201342660 A 10/2013

OTHER PUBLICATIONS

International Search Report and Written Opinion for International Patent Application No. PCT/US2023/071757, mailed Nov. 15, 2023, 17 pages.

(Continued)

*Primary Examiner* — Jarrett J Stark
(74) *Attorney, Agent, or Firm* — Withrow & Terranova, P.L.L.C.

(57) ABSTRACT

Light-emitting diodes (LEDs) and more particularly LED chip structures are disclosed. LED chip structures include arrangements of one or more contacts, interconnects, contact structures, and/or reflective layers that effectively route electrically conductive paths while also reducing instances of closely spaced electrically charged metals of opposing polarities. Certain LED chip structures include electrically isolated metal-containing layers in various chip locations that allow for the presence of n-contact interconnects that are vertically arranged under or proximate to a p-contact. Certain contact structures include various arrangements, including segmented contact structures, that extend laterally to electrically couple groups of n-contact interconnects across various LED chip portions.

11 Claims, 17 Drawing Sheets

(56) References Cited

U.S. PATENT DOCUMENTS

| | | | | |
|---|---|---|---|---|
| 2011/0068359 | A1 | 3/2011 | Yahata et al. | |
| 2012/0049219 | A1* | 3/2012 | Kamiya | H10H 20/833 257/98 |
| 2012/0074441 | A1* | 3/2012 | Seo | H10H 20/814 257/E33.068 |
| 2014/0001502 | A1 | 1/2014 | Akimoto et al. | |
| 2017/0288088 | A1* | 10/2017 | Won Cheol | H10H 20/84 |
| 2018/0198022 | A1 | 7/2018 | Sung et al. | |
| 2020/0044128 | A1 | 2/2020 | Miki et al. | |
| 2020/0194644 | A1* | 6/2020 | Check | H10H 20/8316 |
| 2020/0274027 | A1 | 8/2020 | Huang et al. | |
| 2020/0295229 | A1 | 9/2020 | Kim et al. | |
| 2023/0261157 | A1 | 8/2023 | Balkey et al. | |
| 2023/0395747 | A1* | 12/2023 | Check | H10H 20/816 |
| 2023/0395754 | A1* | 12/2023 | Check | H10H 20/831 |
| 2023/0395756 | A1* | 12/2023 | Check | H10H 20/8312 |

OTHER PUBLICATIONS

Office Action for Taiwanese Patent Application No. 112128844, mailed Jun. 21, 2024, 30 pages.
Notice of Allowance for Taiwanese Patent Application No. 112128844, mailed Oct. 15, 2024, 3 pages.
Notice of Reason for Rejection for Japanese Patent Application No. 2025-511798, mailed Feb. 25, 2026, 11 pages.
Notice of Reason for Rejection for Japanese Patent Application No. 2025-511798, mailed Jun. 2, 2026, 6 pages.

* cited by examiner

LIGHT-EMITTING DIODE CHIP STRUCTURES

FIELD OF THE DISCLOSURE

The present disclosure relates to light-emitting diodes (LEDs) and more particularly to LED chip structures.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection and current injection. To increase current spreading within an LED chip, and in particular for larger area LED chips, it has been found useful to add layers of high electrical conductivity over one or more epitaxial layers of an LED. Additionally, electrodes for the LEDs can have larger surface areas and may include various electrode arrangements that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to light-emitting diodes (LEDs) and more particularly to LED chip structures. LED chip structures include arrangements of one or more contacts, interconnects, contact structures, and/or reflective layers that effectively route electrically conductive paths while also reducing instances of closely spaced electrically charged metals of opposing polarities. Certain LED chip structures include electrically isolated metal-containing layers in various chip locations that allow for the presence of n-contact interconnects that are vertically arranged under or proximate to a p-contact. Certain contact structures include various arrangements, including segmented contact structures, that extend laterally to electrically couple groups of n-contact interconnects across various LED chip portions.

In one aspect, an LED chip comprises: an active LED structure comprising an n-type layer, a p-type layer, and an active layer arranged between the n-type layer and the p-type layer; an n-contact electrically coupled with the n-type layer; a p-contact electrically coupled with the p-type layer; and a plurality of n-contact interconnects electrically coupled between the n-type layer and the n-contact, wherein one or more n-contact interconnects of the plurality of n-contact interconnects are vertically arranged between the p-contact and the n-type layer. In certain embodiments, the one or more n-contact interconnects of the plurality of n-contact interconnects are electrically coupled to an n-contact structure that is electrically coupled to the n-contact. In certain embodiments, the n-contact structure is arranged to laterally extend from a position that is vertically registered with the n-contact to a position that is vertically registered with the p-contact such that the n-contact structure is electrically coupled with the one or more n-contact interconnects of the plurality of n-contact interconnects that are vertically arranged between the p-contact and the n-type layer.

The LED chip may further comprise: a peripheral n-contact interconnect that is electrically coupled to a portion of the n-type layer that is outside a mesa sidewall of the active LED structure, the mesa side wall comprising a sidewall of the p-type layer, the active layer, and a portion of the n-type layer; wherein the n-contact structure is arranged to laterally extend from a position that is vertically registered with the n-contact to the mesa sidewall such that the n-contact structure is electrically coupled to the peripheral n-contact interconnect. In certain embodiments, the peripheral n-contact interconnect is electrically coupled with the one or more n-contact interconnects of the plurality of n-contact interconnects that are vertically arranged between the p-contact and the n-type layer. In certain embodiments, the peripheral n-contact interconnect is electrically coupled to the portion of the n-type layer that is outside the mesa sidewall in a continuous manner proximate two or more peripheral edges of the active LED structure. In certain embodiments, the peripheral n-contact interconnect is electrically coupled to the portion of the n-type layer that is outside the mesa sidewall in a discontinuous manner such that portions of the peripheral n-contact interconnect contact the n-type layer and other portions of the peripheral n-contact interconnect are separated from the n-type layer by a passivation layer.

In certain embodiments, the LED chip further comprises a reflective structure on the active LED structure, wherein the reflective structure comprises a first reflective layer that is electrically insulating, a second reflective layer that is electrically conductive, and a plurality of reflective layer interconnects that extend through the first reflective layer to electrically couple first portions of the second reflective layer to the p-type layer. In certain embodiments, second portions of the second reflective layer are electrically isolated from the active LED structure. In certain embodiments, the second portions of the second reflective layer are vertically arranged between the n-contact structure and the active LED structure. In certain embodiments, a second portion of the second reflective layer is entirely separated from the p-type layer by a passivation layer, and the second portion of the second reflective layer is electrically coupled with the n-contact.

The LED chip may further comprise: a passivation layer on the active LED structure, wherein the plurality of n-contact interconnects extend through portions of the passivation layer; and a first metal-containing interlayer, a second metal-containing interlayer, and a third-metal containing interlayer arranged within the passivation layer, wherein each of the first metal-containing interlayer, the second metal-containing interlayer, and the third-metal containing interlayer are electrically isolated from the n-contact and the p-contact.

In certain embodiments, the n-contact and the p-contact are contact pads arranged to receive external electrical connections when the LED chip is flip-chip mounted.

In another aspect, an LED chip comprises: an active LED structure comprising an n-type layer, a p-type layer, and an active layer arranged between the n-type layer and the p-type layer; a passivation layer on the active LED structure; and a first metal-containing interlayer, a second metal-containing interlayer, and a third-metal containing interlayer at least partially within the passivation layer, wherein each of the first metal-containing interlayer, the second metal-containing interlayer, and the third-metal containing interlayer are electrically isolated from the active LED structure. The LED chip may further comprise: a reflective structure on the active LED structure, wherein the reflective structure comprises a first reflective layer that is electrically insulating, a second reflective layer that is electrically conductive, and a plurality of reflective layer interconnects that extend through the first reflective layer to electrically couple first portions of the second reflective layer to the p-type layer; wherein the second metal-containing interlayer comprises second portions of the second reflective layer that are electrically isolated from the active LED structure. The LED chip may further comprise: an n-contact electrically coupled with the n-type layer; a p-contact electrically coupled with the p-type layer; a plurality of n-contact interconnects electrically coupled between the n-type layer and the n-contact; and an n-contact structure that is electrically coupled with one or more n-contact interconnects of the plurality of n-contact interconnects, wherein the n-contact structure is arranged to laterally extend within the passivation layer. In certain embodiments, the third metal-containing interlayer comprises a same material as the n-contact structure. In certain embodiments, the second metal-containing interlayer is vertically arranged between the n-contact structure and the active LED structure. The LED chip may further comprise: a reflective structure on the active LED structure, wherein the reflective structure comprises a first reflective layer that is electrically insulating, a second reflective layer that is electrically conductive, and wherein the first reflective layer is between the second reflective layer and the p-type layer; wherein the second metal-containing interlayer comprises portions of the second reflective layer that are electrically isolated from the active LED structure. In certain embodiments, the portions of the second reflective layer that are electrically isolated from the active LED structure are vertically arranged between the n-contact structure and the active LED structure. In certain embodiments, the first metal-containing interlayer, the second metal-containing interlayer, and the third metal-containing interlayer are vertically arranged within the passivation layer.

In another aspect, an LED chip comprises: an active LED structure comprising an n-type layer, a p-type layer, and an active layer arranged between the n-type layer and the p-type layer; a plurality of n-contact interconnects electrically coupled to the n-type layer; and an n-contact structure electrically coupled to the plurality of n-contact interconnects, the n-contact structure comprising a first segment that is connected to a first group of n-contact interconnects of the plurality of n-contact interconnects, and a second segment that is connected to a second group of n-contact interconnects of the plurality of n-contact interconnects. In certain embodiments, the first segment of the n-contact structure is discontinuous with the second segment of the n-contact structure. In certain embodiments, the first segment of the n-contact structure is arranged to continuously extend from one edge of the active LED structure to an opposing edge of the active LED structure. In certain embodiments, the second segment of the n-contact structure is arranged to continuously extend without extending to at least one edge of the active LED structure. The LED chip may further comprise: an n-contact electrically coupled with the n-contact structure; and a p-contact electrically coupled with the p-type layer; wherein the plurality of n-contact interconnects are vertically arranged outside peripheral edges of the p-contact. In certain embodiments, the p-contact comprises: a first portion that is vertically arranged between a boundary of the first segment of the n-contact structure and a perimeter of the active LED structure; and a second portion that is vertically arranged between another boundary of the first segment of the n-contact structure and a boundary of the second segment of the n-contact structure, wherein the first portion of the p-contact is discontinuous with the second portion of the p-contact.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
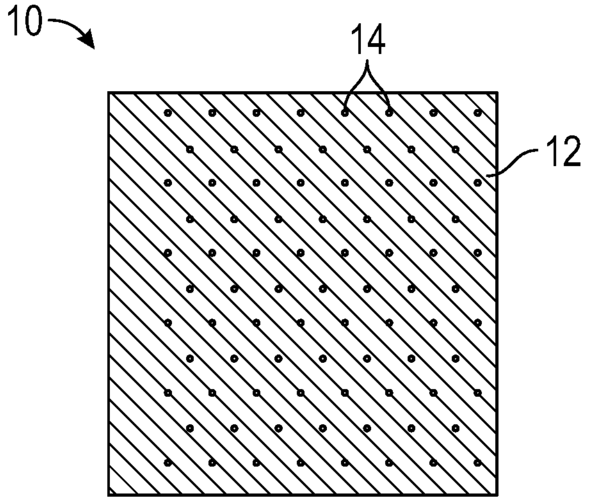
FIG. 1A (RELATED ART)
FIG. 1A is a top view of a typical light-emitting diode (LED) chip with a flip-chip structure that includes an active LED structure and n-contact interconnects that are arranged along or within certain portions of the active LED structure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to light-emitting diodes (LEDs) and more particularly to LED chip structures. LED chip structures include arrangements of one or more contacts, interconnects, contact structures, and/or reflective layers that effectively route electrically conductive paths while also reducing instances of closely spaced electrically charged metals of opposing polarities. Certain LED chip structures include electrically isolated metal-containing layers in various chip locations that allow for the presence of n-contact interconnects that are vertically arranged under or proximate to a p-contact. Certain contact structures include various arrangements, including segmented contact structures, that extend laterally to electrically couple groups of n-contact interconnects across various LED chip portions.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denotated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{i-x-y}Sr_xEu_y$-$AlSiN_3$) and combinations thereof. One or more lumiphoric materials may be provided on one or more portions of an LED chip and/or a submount in various configurations.

Light emitted by the active layer or region of an LED chip may typically travel in a variety of directions. For targeted directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, including flip-chip geometries. Flip-chip structures for LED chips typically include anode and cathode connections that are made from a same side or face of the LED chip. The anode and cathode side is typically structured as a mounting face of the LED chip for flip-chip mounting to another surface, such as a printed circuit board. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate. When electrically activated, light from the active LED structure may pass through the growth substrate in a desired emission direction. In certain embodiments, a flip-chip LED may be devoid of a growth substrate.

In operation, quantum efficiency of LED chips may be related to a variety of factors, such as current injection efficiency and thermal management. Such factors may be of particular importance for larger size LED chips, for example those having lateral dimensions of 500 microns (μm) and above, where current must spread over a larger surface area and the LED chip may generate increased amounts of heat, although the principles disclosed herein are readily applicable to smaller LED chips having lateral dimensions below 500 μm. Current injection across an active LED structure may be provided by electrical connection structures that provide anode and cathode connections for the active LED structure. Anode and cathode connections may include LED chip bond pads that are arranged to receive external electrical connections for the LED chip, and electrically conductive paths between the LED chip bond pads and the active LED structure may be routed by various electrically conductive layers and via structures.

In an exemplary flip-chip LED structure, anode and cathode bond pads are typically arranged on a mounting face of the LED chip with separate internal electrical connections, such as metal layers and via structures, respectively providing electrical coupling between the active LED structure and each of the anode and cathode bond pads. If internal electrical connections having opposing polarities are arranged too close to one another, strong electromotive forces may case electromigration of metals therebetween. For example, strong enough electromotive forces may cause breakdown of dielectric materials that are supposed to provide electrical isolation between the electrical connections of opposing polarities. In addition, metals may migrate through defects present in the dielectric materials, thereby increasing chances for electrical shorting. For these reasons, flip-chip LED structures may typically avoid arranging any electrical connections to the n-type layer between the anode bond pad and the active LED structure.

According to aspects of the present disclosure, flip-chip LED arrangements are disclosed that account for the above-described electromotive forces and allow electrical connections to the n-type layer between the anode bond pad and the active LED structure. By providing such arrangements where n-type electrical connections may be provided along larger LED chip areas, improved current spreading and/or current injection may be realized. Additionally, anode contact pads may be provided with larger surface areas, thereby allowing relative sizing of anode and cathode contact pads to be similar. In this regard, more uniform surface area for mounting anode and cathode contact pads may provide improved mounting integrity with external electrical connections, such as traces on a board on which the LED chip is flip-chip mounted.

Figure 1B:
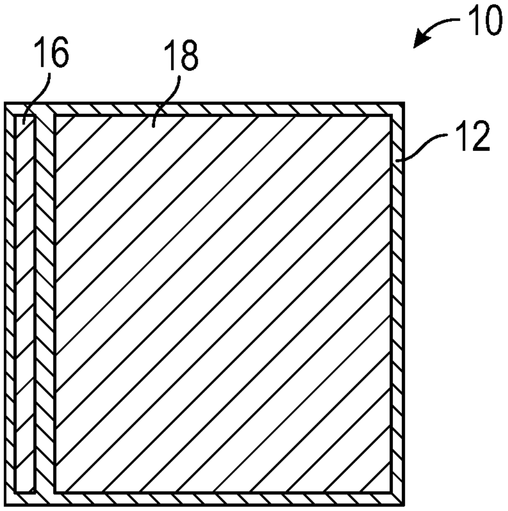
FIG. 1B (RELATED ART)
FIG. 1B is a bottom view of the LED chip of FIG. 1A, illustrating locations of a p-contact and an n-contact.

FIG. 1A is a top view of a typical LED chip 10 with a flip-chip structure that includes an active LED structure 12 and n-contact interconnects 14 that are arranged along or within certain portions of the active LED structure 12. FIG. 1B is a bottom view of the LED chip 10 of FIG. 1A, illustrating locations of a p-contact 16, or p-contact pad, and an n-contact 18, or n-contact pad. The top view of FIG. 1A represents a light-emission side of the LED chip 10 while the bottom view of FIG. 1B represents a mounting side of the LED chip 10. As illustrated in FIG. 1B, the p-contact 16 occupies a relatively small area compared with the n-contact 18. Turning back to FIG. 1A, an area to the left of the LED chip 10 that corresponds with the area of the p-contact 16 from FIG. 1B is devoid of the n-contact interconnects 14 to avoid the above-described problems associated with electromotive forces between closely spaced internal electrical connections having opposing polarities.

Figure 2A:
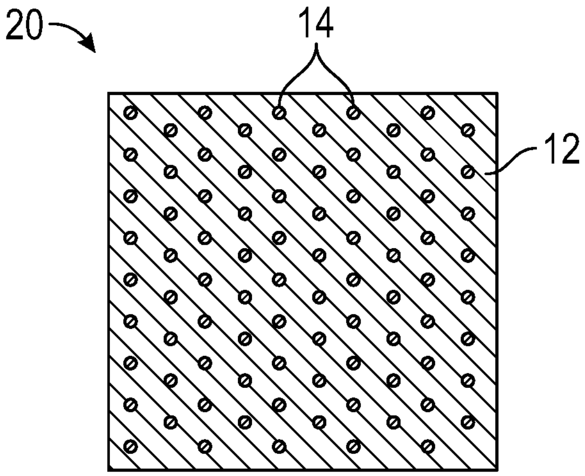
FIG. 2A is a top view of an LED chip with a flip-chip structure where n-contact interconnects are arranged across an increased area of the active LED structure according to principles of the present disclosure.
Figure 2B:
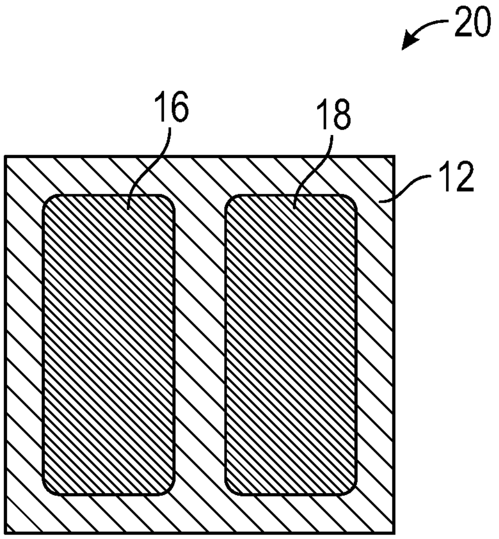
FIG. 2B is a bottom view of the LED chip of FIG. 2A, illustrating locations of the p-contact and the n-contact pad.

FIG. 2A is a top view of an LED chip 20 with a flip-chip structure where n-contact interconnects 14 are arranged across an increased area of the active LED structure 12 according to principles of the present disclosure. FIG. 2B is a bottom view of the LED chip 20 of FIG. 2A, illustrating locations of the p-contact 16 and the n-contact pad 18. As illustrated in FIG. 2A, the n-contact interconnects 14 may be arranged along locations that correspond with an area of the p-contact 16 from FIG. 2B. As will be described later in greater detail, various arrangements of electrical connections between the p-contact 16 and a p-type layer of the active LED structure 12 and electrical connections between the n-contact 18 and an n-type layer of the active LED structure 12 are disclosed that reduce formation of electromotive forces between closely spaced internal electrical connections having opposing polarities. In this manner, one or more of the n-contact interconnects 14 may be arranged between the p-contact 16 and the n-type layer of the active LED structure 12.

Figure 3:
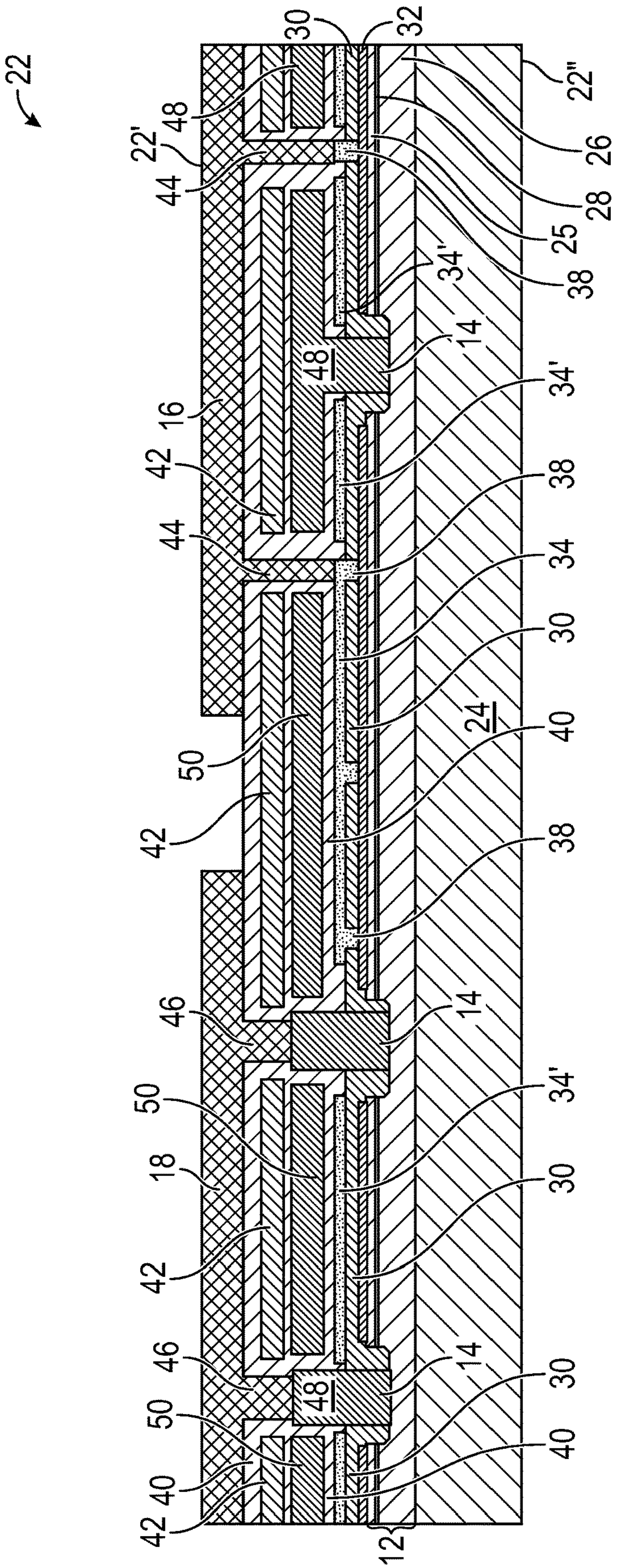
FIG. 3 is a generalized cross-sectional view of a portion of an LED chip that is similar to the LED chip of FIGS. 2A and 2B.

FIG. 3 is a generalized cross-sectional view of a portion of an LED chip 22 that is similar to the LED chip 20 of FIGS. 2A and 2B. The active LED structure 12 is formed on a substrate 24, such as an epitaxial growth substrate. The LED chip 22 may embody a flip-chip structure such that the orientation illustrated in FIG. 3 may be inverted for mounting. In this regard, a mounting face 22' of the LED chip 22 is arranged as the top of the illustration of FIG. 3 and a primary light-emitting face 22" of the LED chip 22 is formed by a surface of the substrate 24. The active LED structure 12 generally comprises a p-type layer 25, an n-type layer 26, and an active layer 28 formed on the substrate 24. In certain embodiments, the n-type layer 26 is arranged between the active layer 28 and the substrate 24. In other embodiments, the doping order may be reversed such that the layer 26 is doped p-type and the layer 25 is doped n-type. The substrate 24 may comprise many different materials such as sapphire or SiC and may have one or more surfaces that are shaped, textured, or patterned to enhance light extraction. In certain embodiments, the substrate 24 is light-transmissive (preferably transparent) to wavelengths of light generated by the active LED structure 12.

The LED chip 22 may include a first reflective layer 30 provided on the p-type layer 25. In certain embodiments, a current spreading layer 32, such as a thin layer of a transparent conductive oxide such indium tin oxide (ITO) or a metal such as platinum (Pt), may be provided between the p-type layer 25 and the first reflective layer 30. The first reflective layer 30 may comprise many different materials and preferably comprises a material that presents an index of refraction step with the material comprising the active LED structure 12 to promote total internal reflection (TIR) of light generated from the active LED structure 12. Light that experiences TIR may be redirected without experiencing absorption or loss and may thereby contribute to useful or desired LED chip emission. In certain embodiments, the first reflective layer 30 comprises a material with an index of refraction lower than the index of refraction of the active LED structure 12 material. The first reflective layer 30 may comprise many different materials, with some having an index of refraction less than 2.3, while others may have an index of refraction less than 2.15, less than 2.0, and less than 1.5. In certain embodiments, the first reflective layer 30 comprises a dielectric material, with certain embodiments comprising silicon dioxide ($SiO_2$) and/or silicon nitride (SiN). It is understood that many dielectric materials may be used such as SiN, $SiN_x$, $Si_3N_4$, Si, germanium (Ge), $SiO_2$, $SiO_x$, titanium dioxide ($TiO_2$), tantalum pentoxide ($Ta_2O_5$), ITO, magnesium oxide (MgOx), zinc oxide (ZnO), and combinations thereof. By providing the first reflective layer 30 as a dielectric layer, the first reflective layer 30 may advantageously be positioned across the active LED structure 12 without concern for electrical shorting between anode and cathode electrical connections. In certain embodiments, the first reflective layer 30 may include multiple alternating layers of different dielectric materials, e.g., alternating layers of SiO2 and SiN that symmetrically repeat or are asymmetrically arranged.

The LED chip 22 may further include a second reflective layer 34 that is on the first reflective layer 30 such that the first reflective layer 30 is arranged between the active LED structure 12 and the second reflective layer 34. The second reflective layer 34 may include a metal layer that is configured to reflect any light from the active LED structure 12 that may pass through the first reflective layer 30. The second reflective layer 34 may comprise many different materials such as Ag, gold (Au), Al, or combinations thereof. As illustrated, the second reflective layer 34 may include one or more reflective layer interconnects 38 that provide electrically conductive paths through the first reflective layer 30 to electrically couple the second reflective layer 34 to the p-type layer 25. In certain embodiments, the reflective layer interconnects 38 comprise reflective layer vias. Accordingly, the first reflective layer 30, the second reflective layer 34, and the reflective layer interconnects 38 form a reflective structure of the LED chip 22. In certain embodiments, the reflective layer interconnects 38 comprise the same material as the second reflective layer 34 and are formed at the same time as the second reflective layer 34. In other embodiments, the reflective layer interconnects 38 may comprise a different material than the second reflective layer 34. The LED chip 22 may optionally comprise a barrier layer on a portion of the second reflective layer 34 that is opposite the reflective layer interconnects 38 to prevent migration of the second reflective layer 34 material, such as Ag, to other layers. Such a barrier layer may comprise an electrically conductive material, with suitable materials including but not limited to sputtered Ti/Pt followed by evaporated Au bulk material or sputtered Ti/Ni followed by an evaporated Ti/Au bulk material. A passivation layer 40 is included on the second reflective layer 34. The passivation layer 40 is arranged to protect and provide electrical insulation for the LED chip 22 and may comprise many different materials, such as a dielectric material. In certain embodiments, the passivation layer 40 is a single layer, and in other embodiments, the passivation layer 40 comprises a plurality of layers. Suitable materials for the passivation layer 40 include but are not limited to silicon nitride, silicon dioxide, aluminum oxide, and silicon oxy-nitride. In certain embodiments, the passivation layer 40 includes a first metal-containing interlayer 42 arranged therein, wherein the first interlayer 42 may comprise Al or another suitable metal. Notably, the first interlayer 42 is embedded within the passivation layer 40 and is electrically isolated from the active LED structure 12. In application, the first interlayer 42 may function as a crack stop layer for any cracks that may propagate through the passivation layer 40.

In FIG. 3, the p-contact 16 and the n-contact 18 are arranged on the passivation layer 40 and are configured to receive external electrical connections and provide portions of electrically conductive paths to the active LED structure 12. The p-contact 16, which may also be referred to as an anode contact, may comprise one or more p-contact vias 44 that extend through the passivation layer 40 to provide an electrically conductive path to the p-type layer 25 by way of the second reflective layer 34 and the reflective layer interconnects 38. In certain embodiments, the one or more p-contact vias 44 may be referred to as p-feeds for the p-contact 16. The n-contact 18, which may also be referred to as a cathode contact, may comprise one or more n-contact vias 46 that extend through the passivation layer 40 and are electrically coupled with the n-contact interconnects 14 to provide an electrical path to the n-type layer 26.

The n-contact interconnects 14 may be formed as part of an n-contact structure 48 that is embedded within the passivation layer 40. The n-contact structure 48 is arranged to be electrically coupled between the n-contact 18 and the n-type layer 26. The n-contact structure 48 may embody a continuous metal structure that includes both the n-contact interconnects 14 and lateral extensions that traverse around the p-contact vias 44. Since FIG. 3 is a cross-section, it is understood that the n-contact structure 48 is continuous by way of portions that extend around the p-contact vias 44 out of a plane of the cross-section of FIG. 3. In this manner, the portion of the n-contact structure 48 illustrated between the p-contact 16 and the active LED structure 12 is continuous and electrically coupled with portions of the n-contact structure 48 illustrated between the n-contact 18 and the active LED structure 12. The n-contact structure 48 is arranged to laterally extend across the LED chip 22 to route electrically conductive paths between the n-contact 18 and many different areas of the n-type layer 26 for improved current spreading. In certain locations where the n-contact vias 46 connect with the n-contact structure 48, such locations may also be vertically aligned or registered with locations of some of the n-contact interconnects 14. The lateral extensions of the n-contact structure 48 may extend from the n-contact vias 46 to locations of the LED chip 22 that are outside an area of the n-contact 18 to electrically connect with other n-contact interconnects 14. For example, a portion of the n-contact structure 48 is arranged to extend from a location vertically registered with an area of the n-contact 18 to an area of the LED chip 22 that is vertically registered with an area of the p-contact 16. In this manner, one or more of the n-contact interconnects 14 are vertically arranged between the p-contact 16 and the n-type layer 26. While a single one of the n-contact interconnects 14 is illustrated vertically between the p-contact 16 and the active LED structure 12, in practice, an array of the n-contact interconnects 14 may be present to effectively spread current along larger areas of the LED chip 22 underneath the p-contact 16.

As described above, if internal electrical connections having opposing polarities (i.e., from n and p contacts) are arranged too close to one another, strong electromotive forces may case electromigration of metals therebetween, thereby increasing chances of dielectric breakdown and/or electrical shorting. In this manner, certain portions 34', or second portions, of the second reflective layer 34 are formed to be electrically isolated or electrically decoupled from the p-contact 16. Such portions 34' of the second reflective layer 34 may be located proximate n-contact interconnects 14 and the n-contact structure 48 that are vertically registered with one or both of the p-contact 16 and the n-contact 18. The portions 34' of the second reflective layer 34 may form electrically isolated metal layers that are embedded in dielectric materials, such as a combination of the first reflective layer 30 and the passivation layer 40. In certain embodiments, such electrical isolation may be provided by patterning the portions 34' in a discontinuous manner with the remainder of the second reflective layer 34. The electrically isolated portions 34' of the second reflective layer 34 may be referred to as a second interlayer or a second metal-containing interlayer of the LED chip 22. In certain embodiments, the electrically isolated portions 34' of the second reflective layer 34 that are vertically registered with the p-contact 16 and the n-contact structure 48 may be devoid of reflective layer interconnects 38. In this manner, any migration of metals between the electrically activated n-contact structure 48 and the electrically isolated portions 34' of the second reflective layer 34 may not create a shorting path to the p-contact 16 by way of the current spreading layer 32.

In certain embodiments, a third interlayer 50 may be formed by electrically isolating portions of the n-contact structure 48 from the active LED structure 12. In this manner, the third interlayer 50 may be formed concurrently and of a same material as the n-contact structure 48, and the third interlayer 50 is electrically floating within the LED chip 22 in a similar manner to the first and second interlayers (i.e., 42 and 34'). In certain embodiments, the third interlayer 50 may be formed in portions of the LED chip 22 that are vertically registered with the n-contact 18 and/or in areas of the LED chip 22 that extend between the p-contact 16 and the n-contact 18. In certain areas, such as between the n-contact 18 and the active LED structure 12, the first interlayer 42, the electrically isolated portions 34' of the second reflective layer 34 (or second interlayer), and the third interlayer 50 may all be vertically registered with one another within the passivation layer 40. Accordingly, no electrical charging may be initiated for any of the interlayers and a multiple layer structure for enhanced crack stopping within the passivation layer 40 is provided. In certain embodiments, the first interlayer 42, the electrically isolated portions 34' of the second reflective layer 34 (or second interlayer), and the third interlayer 50 are all positioned at least partially within the passivation layer 40. In this manner, portions of the passivation layer 40 may be arranged to provide vertical separation between the first interlayer 42, the electrically isolated portions 34' of the second reflective layer 34 (or second interlayer), and the third interlayer 50.

FIGS. 4A to 12 illustrate cross-sectional views and corresponding top views for a sequence of fabrication steps for an LED chip 52 that is similar to the LED chip 22 of FIG. 3. For illustrative purposes, the cross-sectional views represent generalized illustrations showing arrangements of various features of the LED chip 52 while the corresponding top views are provided to illustrate exemplary layouts of the features illustrated in the cross-sectional views. In this manner, the cross-sectional views are not necessarily direct cross-sections taken from the top views. Rather, the cross-sectional views provide detailed structures and the top views provide general layouts of how such structures may be arranged across larger areas of the LED chip 52. Additionally, the sequence of fabrication steps may represent various steps and it is understood intermediate fabrication steps may also be provided.

Figure 4A:
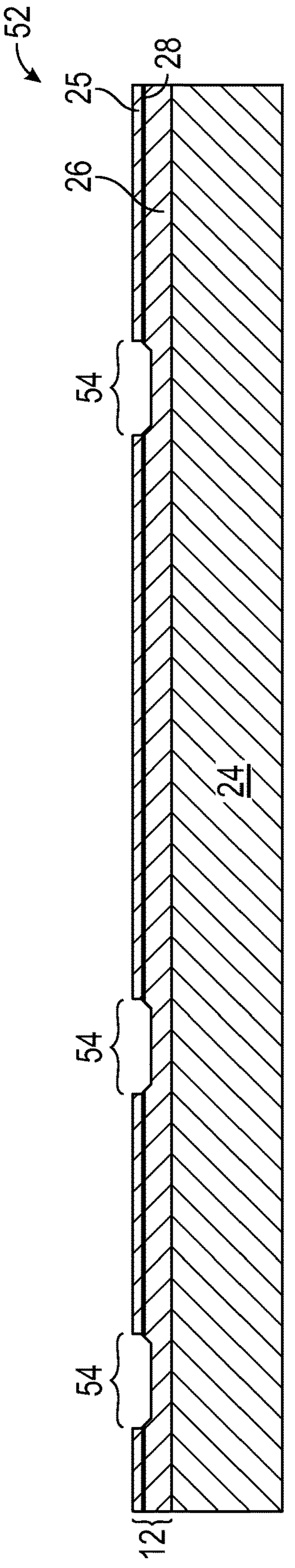
FIG. 4A is a cross-sectional view of a portion of an LED chip at a fabrication step after an active LED structure is formed on a substrate and a number of first openings have been defined though a p-type layer, an active layer, and a portion of an n-type layer of the active LED structure.
Figure 4B:
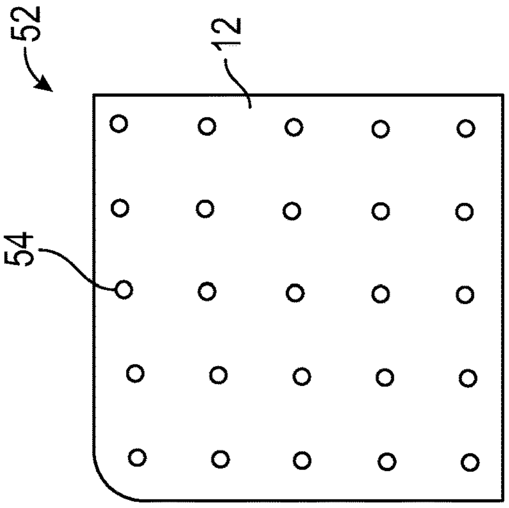
FIG. 4B is an exemplary top view of the LED chip of FIG. 4A illustrating how the first openings may be arranged in an array across the LED chip.

FIG. 4A is a cross-sectional view of a portion of the LED chip 52 at a fabrication step after the LED structure 12 is formed on the substrate 24 and a number of first openings 54 have been defined though the p-type layer 25, the active layer 28, and a portion of the n-type layer 26. The first openings 54 may be formed by a patterned removal process, such as patterned etching of the active LED structure 12. FIG. 4B is an exemplary top view of the LED chip 52 of FIG. 4A illustrating how the first openings 54 may be arranged in an array across the LED chip 52. As will be later described, the first openings 54 define areas of the n-type layer 26 where the n-contact interconnects 14 of FIG. 3 will later be formed.

Figure 5A:
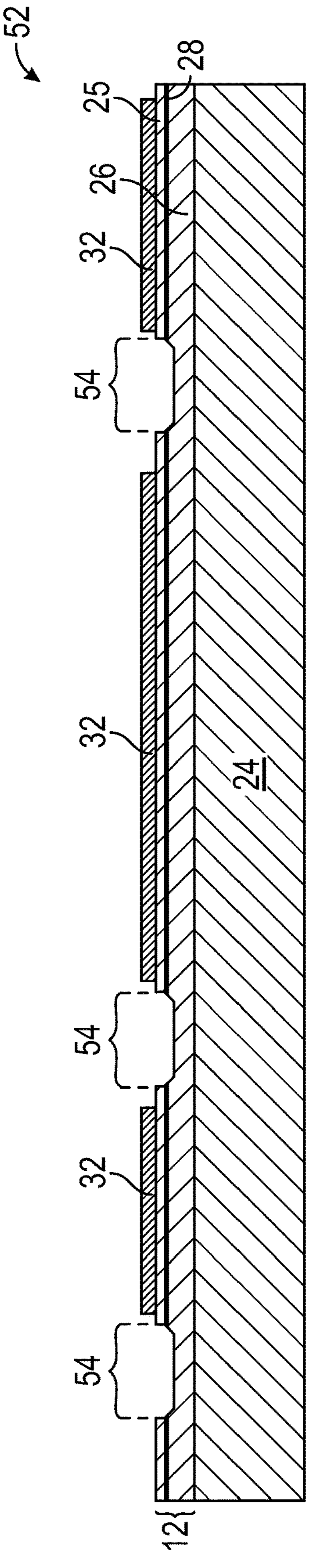
FIG. 5A is a cross-sectional view of a portion of the LED chip of FIG. 4A at a fabrication step after a current spreading layer is formed on the p-type layer.
Figure 5B:
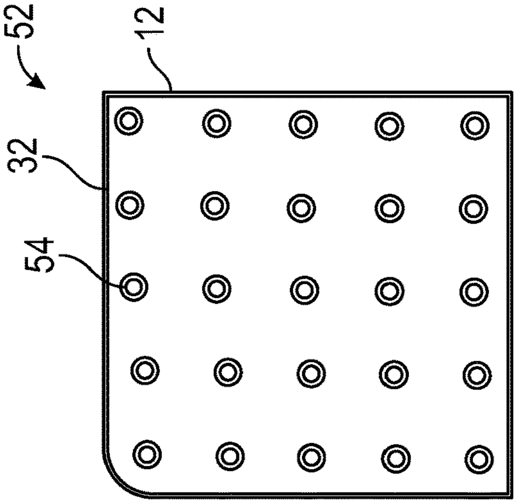
FIG. 5B is an exemplary top view of the LED chip of FIG. 5A illustrating how the current spreading layer may be arranged relative to each of the first openings.

FIG. 5A is a cross-sectional view of a portion of the LED chip 52 of FIG. 4A at a fabrication step after the current spreading layer 32 is formed on the p-type layer 25. FIG. 5B is an exemplary top view of the LED chip 52 of FIG. 5A illustrating how the current spreading layer 32 may be arranged relative to each of the first openings 54. The current spreading layer 32 may selectively formed along the p-type layer 25 without extending entirely to each of the first openings 54. In this manner, a setback is laterally formed between edges of the current spreading layer 32 and the first openings 54 to avoid have the electrically conductive materials of the current spreading layer 32 cause electrical shorting along sidewalls of the p-type layer 25 and n-type layer 26 within the first openings 54.

Figure 6A:
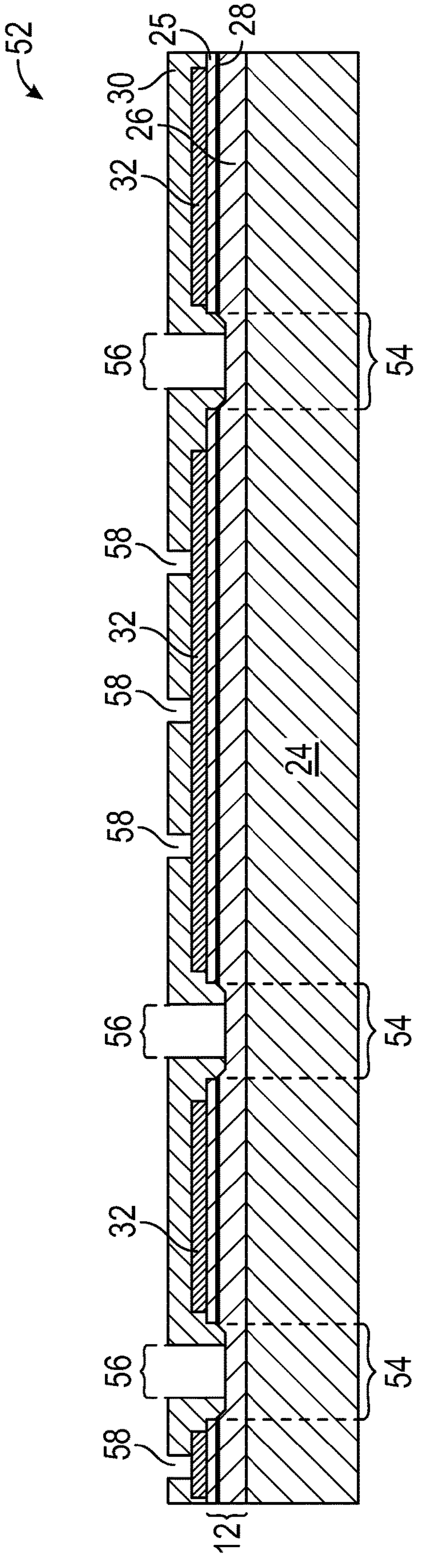
FIG. 6A is a cross-sectional view of a portion of the LED chip of FIG. 5A at a fabrication step after a first reflective layer is formed and a number of second openings and third openings are formed through the first reflective layer.
Figure 6B:
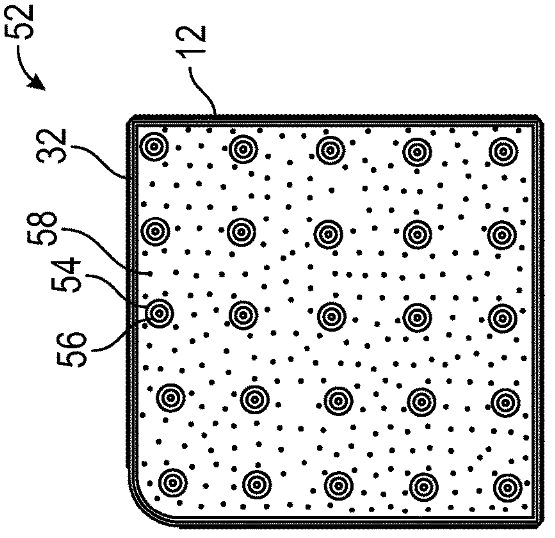
FIG. 6B is an exemplary top view of the LED chip of FIG. 6A illustrating how the second openings and the third openings may be arranged relative to the first openings.

FIG. 6A is a cross-sectional view of a portion of the LED chip 52 of FIG. 5A at a fabrication step after the first reflective layer 30 is formed and a number of second openings 56 and third openings 58 are formed through the first reflective layer 30. FIG. 6B is an exemplary top view of the LED chip 52 of FIG. 6A illustrating how the second openings 56 and the third openings 58 may be arranged relative to the first openings 54. As illustrated, the second openings 56 are arranged to be vertically registered with the first openings 54, thereby providing a combined opening to exposed portions of the n-type layer 26. In certain embodiments, the second openings 56 may be provided with narrower diameters than the first openings 54 to reduce instances of electrical shorting when subsequent elements are formed. The third openings 58 may be formed across other portions of the first reflective layer 30 to expose portions of the current spreading layer 32. As will be later described, the third openings 58 define areas where the reflective layer interconnects 38 of FIG. 3 will later be formed to make electrical connections with the p-type layer 25 via the current spreading layer 32. As best illustrated in FIG. 6B, the first and second openings 54, 56 may be formed in an array that is spaced apart across the LED chip 52 and the third openings 58 may formed in another array across the LED chip 52. In this manner, future n-type and p-type electrical connections may be arranged across the LED chip 52 for effective current spreading.

Figure 7A:
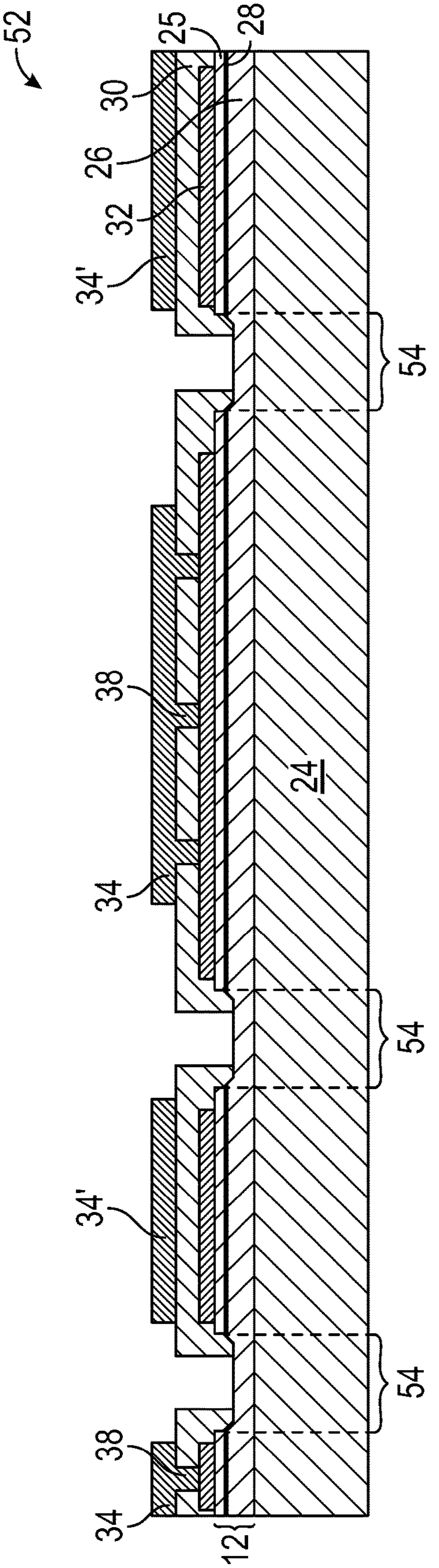
FIG. 7A is a cross-sectional view of a portion of the LED chip of FIG. 6A at a fabrication step after a second reflective layer is formed on the first reflective layer.
Figure 7B:
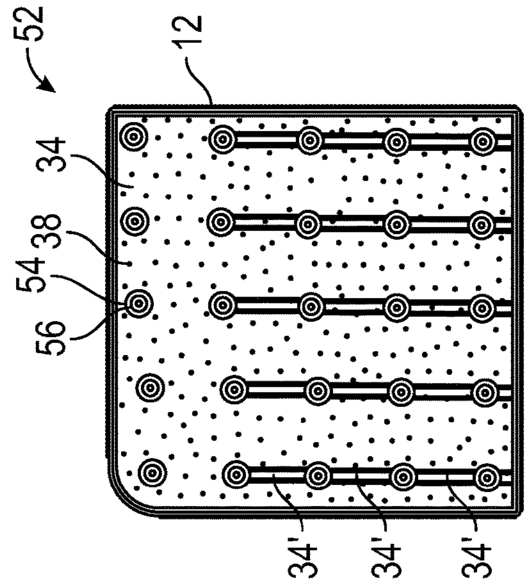
FIG. 7B is an exemplary top view of the LED chip of FIG. 7A illustrating how the second reflective layer may be arranged relative to the first and second openings.

FIG. 7A is a cross-sectional view of a portion of the LED chip 52 of FIG. 6A at a fabrication step after the second reflective layer 34 is formed on the first reflective layer 30. FIG. 7B is an exemplary top view of the LED chip 52 of FIG. 7A illustrating how the second reflective layer 34 may be arranged relative to the first and second openings 54, 56. As illustrated, the second reflective layer 34 may be formed on portions of the active LED structure 12 that are between the first openings 54. In this manner, the second reflective layer 34 may be formed over portions of the p-type layer 25. During deposition, the second reflective layer 34 may fill the third openings 58 of FIG. 6A to provide the reflective layer interconnects 38. Additionally, the portions 34' of the second reflective layer 34 that are electrically isolated may be formed on portions of the first reflective layer 30 that are devoid of the third openings 58 of FIG. 6A. As best illustrated in the top view of FIG. 7B, the portions 34' may be formed between adjacent ones of the first openings 54. As will later be described in greater detail, such regions where the portions 34' are regions where portions of the n-contact structure 48 of FIG. 3 will laterally extend to electrically couple neighboring ones of the n-contact interconnects 14 of FIG. 3. In this manner, having electrically charged metal layers of opposite polarities in such regions may be avoided.

Figure 8:
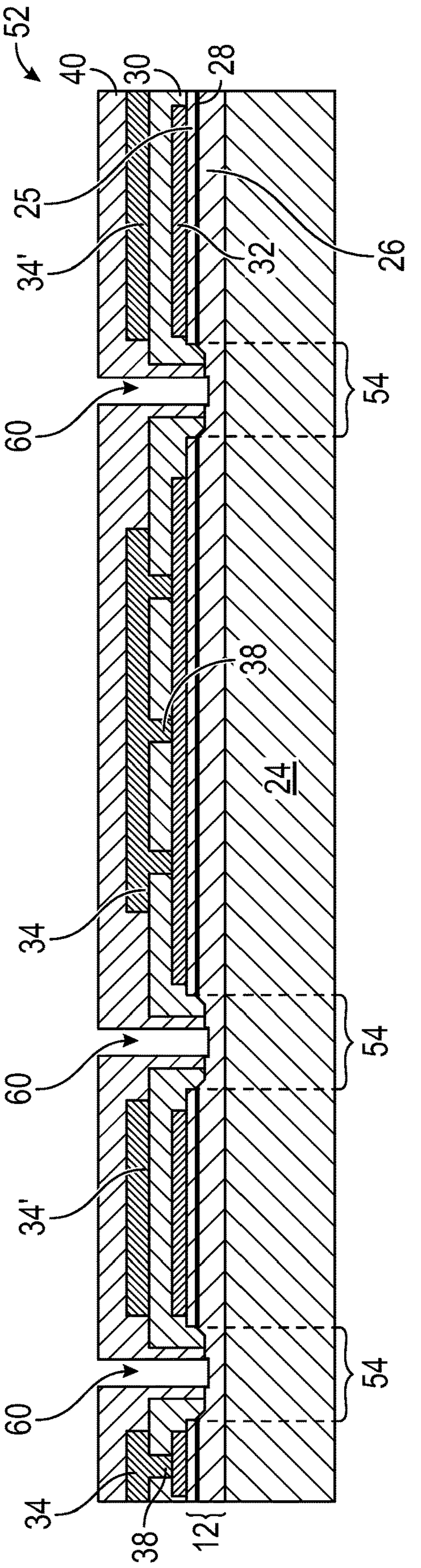
FIG. 8 is a cross-sectional view of a portion of the LED chip of FIG. 7A at a fabrication step after a portion of a passivation layer is formed on the second reflective layer.

FIG. 8 is a cross-sectional view of a portion of the LED chip 52 of FIG. 7A at a fabrication step after a portion of the passivation layer 40 is formed on the second reflective layer 34. The passivation layer 40 may be blanket deposited and fourth openings 60 may be defined in regions that are vertically registered with centers of the first openings 54. In this manner, electrically conductive paths to the n-type layer 26 are provided.

Figure 9A:
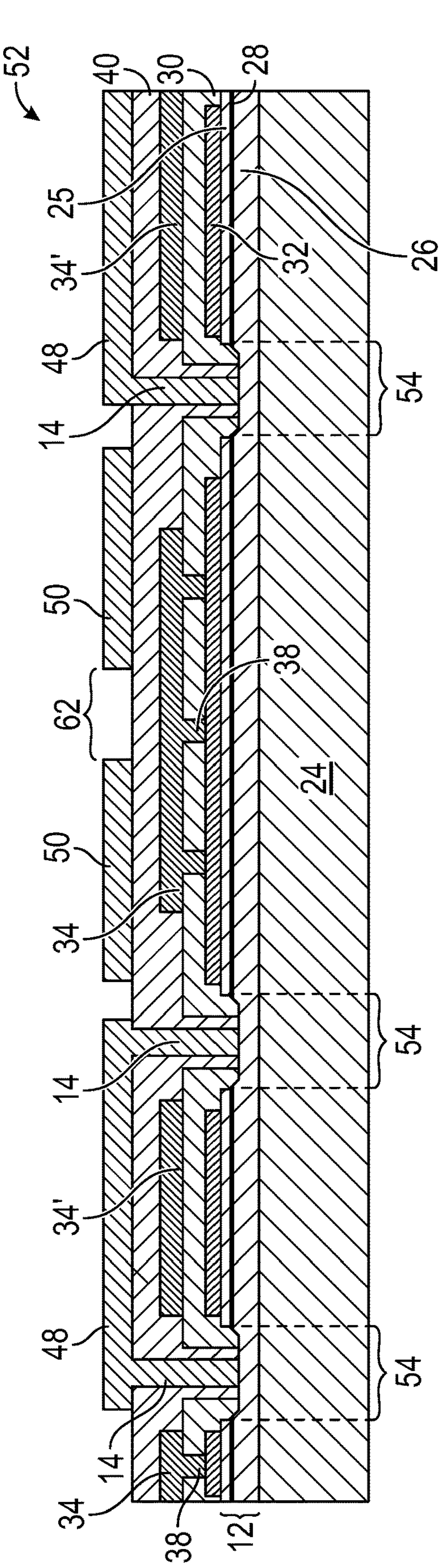
FIG. 9A is a cross-sectional view of a portion of the LED chip of FIG. 8 at a fabrication step after an n-contact structure, n-contact interconnects, and a third interlayer are formed.
Figure 9B:
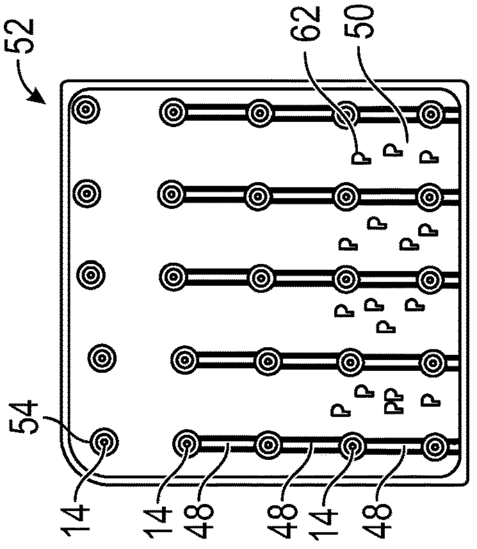
FIG. 9B is an exemplary top view of the LED chip of FIG. 9A illustrating a layout pattern of the n-contact structure, the n-contact interconnects, and the third interlayer across the active LED structure.

FIG. 9A is a cross-sectional view of a portion of the LED chip 52 of FIG. 8 at a fabrication step after the n-contact structure 48, the n-contact interconnects 14, and the third interlayer 50 are formed. FIG. 9B is an exemplary top view of the LED chip 52 of FIG. 9A illustrating a layout pattern of the n-contact structure 48, the n-contact interconnects 14, and the third interlayer 50 across the active LED structure 12. As illustrated, the n-contact interconnects 14 may be formed within each of the fourth openings 60 of FIG. 8. The n-contact structure 48 may form electrically conductive paths between neighboring pairs of the n-contact interconnects 14. The third interlayer 50 may be formed along other portions of the passivation layer 40 outside the n-contact structure 48. A plurality of fifth openings 62 may be formed along portions of the third interlayer 50 that define locations of the p-contact vias 44 of FIG. 3. The fifth openings 62 may be arranged with many different shapes, such as circular. In FIG. 9B, the fifth openings 62 are illustrated as the letter P to indicated locations of electrically conductive paths to the later formed p-contact 16.

Figure 10A:
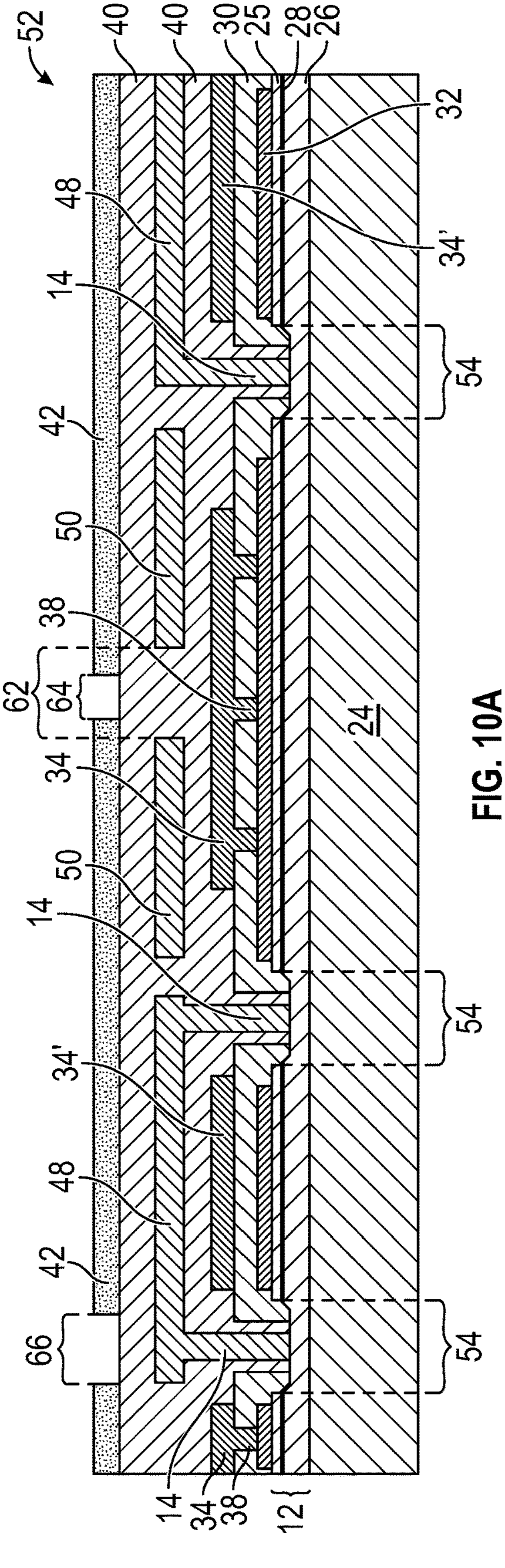
FIG. 10A is a cross-sectional view of a portion of the LED chip of FIG. 9A at a fabrication step after additional portions of the passivation layer and a first interlayer are formed.
Figure 10B:
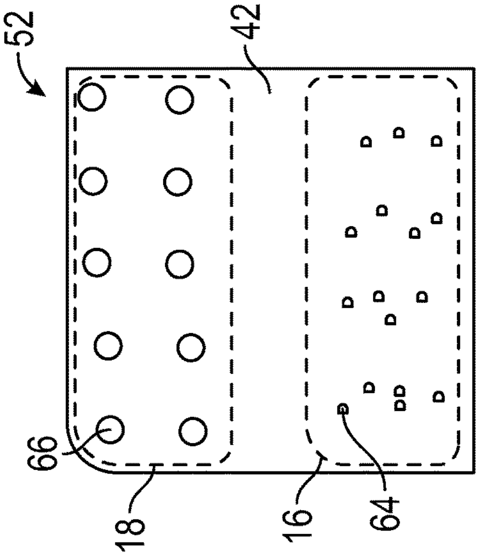
FIG. 10B is an exemplary top view of the LED chip of FIG. 10A illustrating a layout pattern of the first interlayer.

FIG. 10A is a cross-sectional view of a portion of the LED chip 52 of FIG. 9A at a fabrication step after additional portions of the passivation layer 40 and the first interlayer 42 are formed. FIG. 10B is an exemplary top view of the LED chip 52 of FIG. 10A illustrating a layout pattern of the first interlayer 42. The first interlayer 42 may be blanket deposited on the passivation layer 40 with sixth openings 64 and seventh openings 66 defined therein. The sixth openings 64 are registered with the fifth openings 62 to define electrically conductive paths for the later formed p-contact 16. The seventh openings 66 define areas where the later formed n-contact vias 46 will be formed. As illustrated in FIG. 10B, the sixth openings 64 and the seventh openings 66 may be formed in respective arrays that are spaced from one another along the LED chip 52, thereby defining areas where the p-contact 16 and the n-contact 18 may later be formed. For illustrative purposes, exemplary areas of the p-contact 16 and the n-contact 18 are provided by superimposed dashed boxes in FIG. 10B. In this manner, an area of the p-contact 16 may be increased irrespective of the locations of the n-contact interconnects 14.

Figure 11:
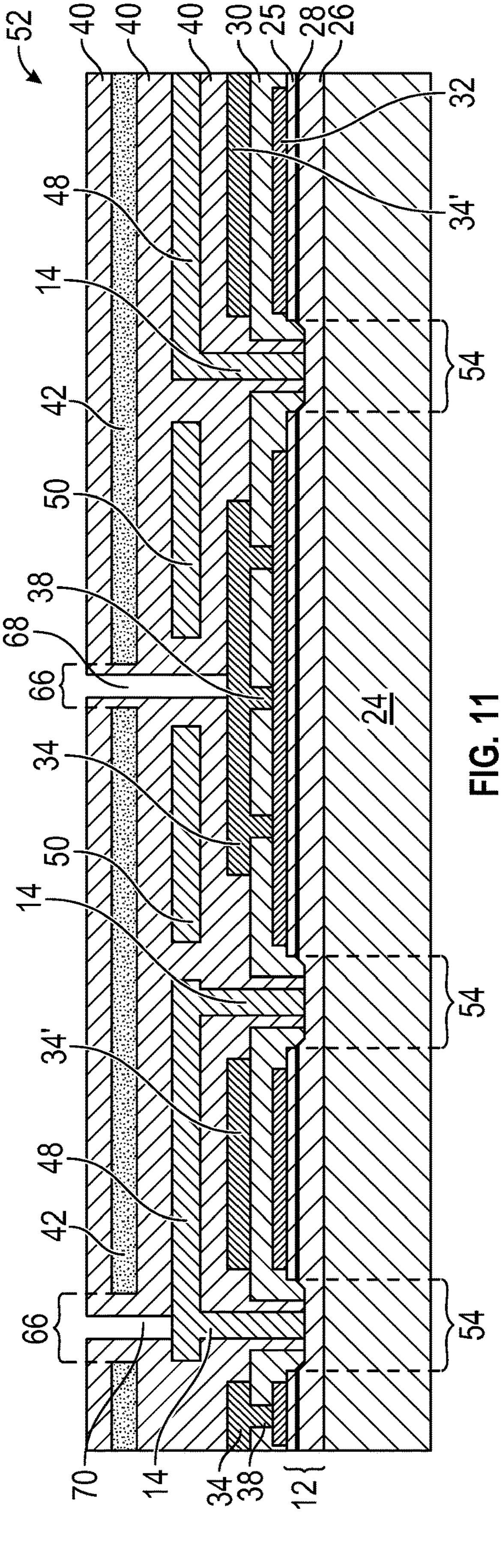
FIG. 11 is a cross-sectional view of a portion of the LED chip of FIG. 10A at a fabrication step after additional portions of the passivation layer are formed over the first interlayer and eighth and ninth openings are respectively formed through sixth openings and seventh openings.

FIG. 11 is a cross-sectional view of a portion of the LED chip 52 of FIG. 10A at a fabrication step after additional portions of the passivation layer 40 are formed over the first interlayer 42 and eighth and ninth openings 68, 70 are respectively formed through the sixth openings 64 and the seventh openings 66. The eight openings 68 are formed through central portions of the sixth openings 64 and through the passivation layer 40 to define locations of the later formed p-contact vias 44. In a similar manner, the ninth openings 70 are formed through central portions of the seventh openings 66 and through the passivation layer 40 to define locations of the later formed n-contact vias 46.

Figure 12:
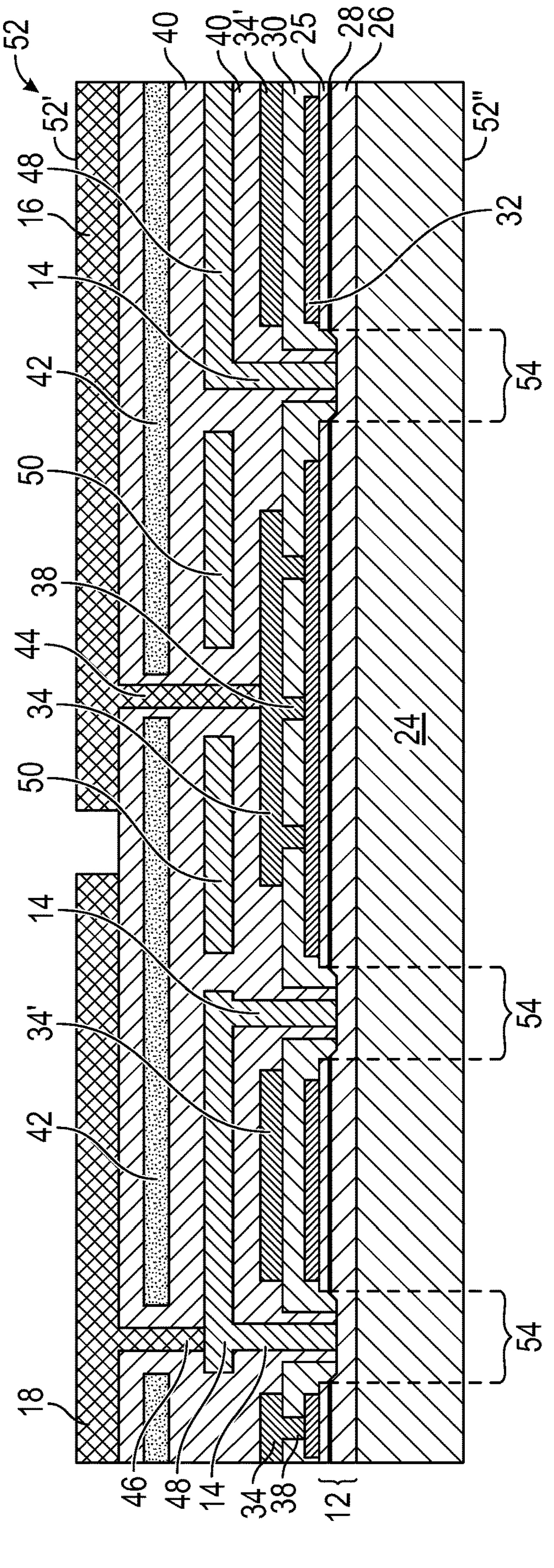
FIG. 12 is a cross-sectional view of a portion of the LED chip of FIG. 11 at a fabrication step after a p-contact, p-contact vias, an n-contact, and n-contact vias are formed.

FIG. 12 is a cross-sectional view of a portion of the LED chip 52 of FIG. 11 at a fabrication step after the p-contact 16, the p-contact vias 44, the n-contact 18, and the n-contact vias 46 are formed. The LED chip 52 is accordingly arranged for flip-chip mounting with another surface. In this manner, the p-contact 16 and the n-contact 18 are arranged at a mounting face 52' of the LED chip 52 and a surface of the substrate 24 may form a primary light-emitting face 52" of the LED chip 52. In a similar manner to the LED chip 22 of FIG. 3, electrically isolated portions 34' of the second reflective layer 34, or the second interlayer, may be arranged between electrically active portions of the n-contact structure 48 and the active LED structure 12. The third interlayer 50, or electrically inactive portions of the n-contact structure 48, may be arranged in locations of the LED chip 52 that are over electrically active portions of the second reflective layer 34. In this manner, the LED chip 52 may be provided with a structure that reduces electromotive forces and corresponding electromigration of metals associated when electrically charged metal layers of opposite polarities are in close proximity to one another.

Figure 13A:
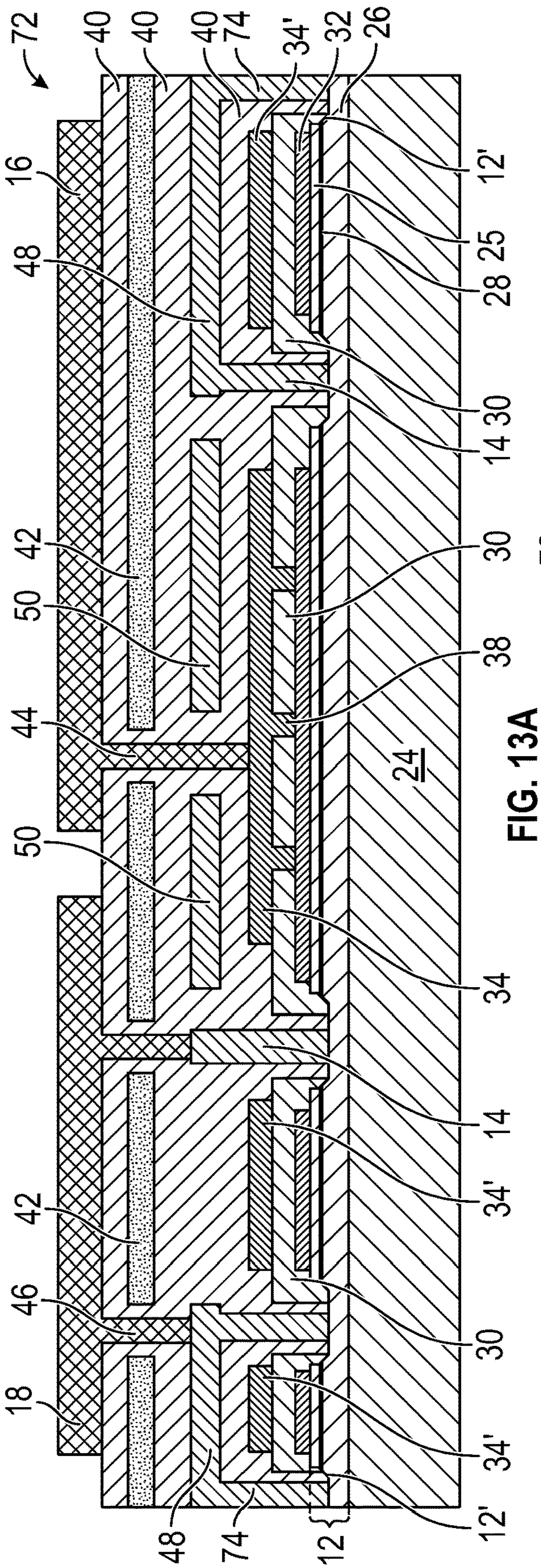
FIG. 13A is a cross-sectional view of a portion of an LED chip that is similar to the LED chip of FIG. 12A and where the n-contact structure further includes a peripheral n-contact interconnect that traverses along peripheral edges of the LED chip.

FIG. 13A is a cross-sectional view of a portion of an LED chip 72 that is similar to the LED chip 52 of FIG. 12A and where the n-contact structure 48 further includes a peripheral n-contact interconnect 74 that traverses along peripheral edges of the LED chip 72. In a similar manner as the LED chip 52 of FIG. 12, electrically isolated portions 34' of the second reflective layer 34 may be arranged between electrically active portions of the n-contact structure 48 and the active LED structure 12, and the third interlayer 50 may be arranged in locations of the LED chip 72 that are over electrically active portions of the second reflective layer 34. Depending on the layout of the n-contact interconnects 14 of the LED chip 72, the one or more peripheral n-contact interconnects 74 may be arranged proximate perimeter mesa sidewalls 12' of the active LED structure 12. The peripheral n-contact interconnect 74 may be formed through portions of the passivation layer 40 and first reflective layer 30 in a similar manner as the n-contact interconnects 14. The peripheral n-contact interconnect 74 may be electrically coupled to portions of the n-type layer 26 that are outside the perimeter mesa sidewalls 12', thereby providing additional electrically conductive paths to the active LED structure 12 for enhanced current spreading and injection. Portions of the passivation layer 40 and/or the first reflective layer 30 may be arranged between the perimeter mesa sidewalls 12' and the peripheral n-contact interconnect 74 to avoid shorting. In certain embodiments, portions of the n-contact structure 48 may be arranged to electrically couple the peripheral n-contact interconnects 74 to one or more of the n-contact interconnects 14 that are positioned inside the perimeter mesa sidewalls 12'. In certain embodiments, the peripheral n-contact interconnect 74 may be electrically coupled to the n-type layer 26 in a continuous manner proximate two or more peripheral edges, or even all peripheral edges of the active LED structure 12.

Figure 13B:
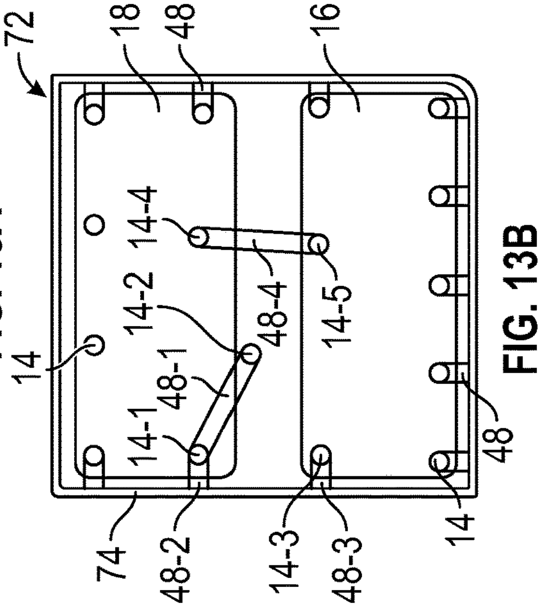
FIG. 13B is an exemplary top view of the LED chip of FIG. 13A illustrating a layout pattern of n-contact interconnects, the peripheral n-contact interconnect, and an n-contact relative to a p-contact.

FIG. 13B is an exemplary top view of the LED chip 72 of FIG. 13A illustrating a layout pattern of the n-contact interconnects 14, the peripheral n-contact interconnect 74, and the n-contact 18 relative to the p-contact 16. In certain embodiments, the peripheral n-contact interconnect 74 is a single continuous structure that traverses around the perimeter of the LED chip 72. The peripheral n-contact interconnect 74 and portions of the n-contact structure 48 may effectively route current between the n-contact 18 and n-contact interconnects 14 that are between the n-contact 18 and the p-contact 16 and/or that are vertically registered with the p-contact 16. By way of example, a first n-contact interconnect 14-1 is vertically registered and electrically coupled with the n-contact 18. A first portion 48-1 of the n-contact structure 48 is arranged to laterally extend and electrically couple the first n-contact interconnect 14-1 with a second n-contact interconnect 14-2 that is vertically arranged between the n-contact 18 and the p-contact 16. A second portion 48-2 of the n-contact structure 48 is arranged to electrically couple the first n-contact interconnect 14-1 with the peripheral n-contact interconnect 74, and a third portion 48-3 of the n-contact structure 48 electrically couples a third n-contact interconnect 14-3 with the peripheral n-contact interconnect 74. In another example, a fourth n-contact interconnect 14-4 is vertically registered and electrically coupled with the n-contact 18, and a fourth portion 48-4 of the n-contact structure 48 electrically couples the fourth n-contact interconnect 14-4 to a fifth n-contact interconnect 14-5 that is vertically registered with the p-contact 16. In this manner, electrically conductive pathways are provided between the n-contact 18 and multiple n-contact interconnects 14-1 to 14-5, irrespective of their locations relative to the n-contact 18 and the p-contact 16.

Figure 14A:
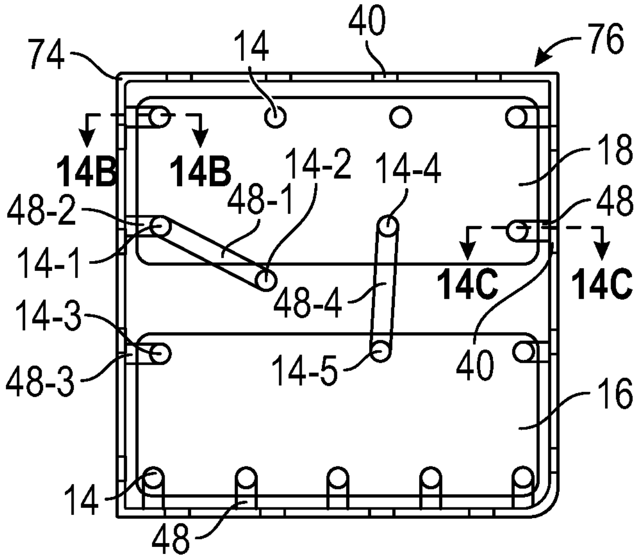
FIG. 14A is an exemplary top view of an LED chip that is similar to the LED chip of FIGS. 13A and 13B and further represents embodiments where electrical connections between the peripheral n-contact interconnect and the n-type layer are segmented along a perimeter of the LED chip.
Figure 14B:
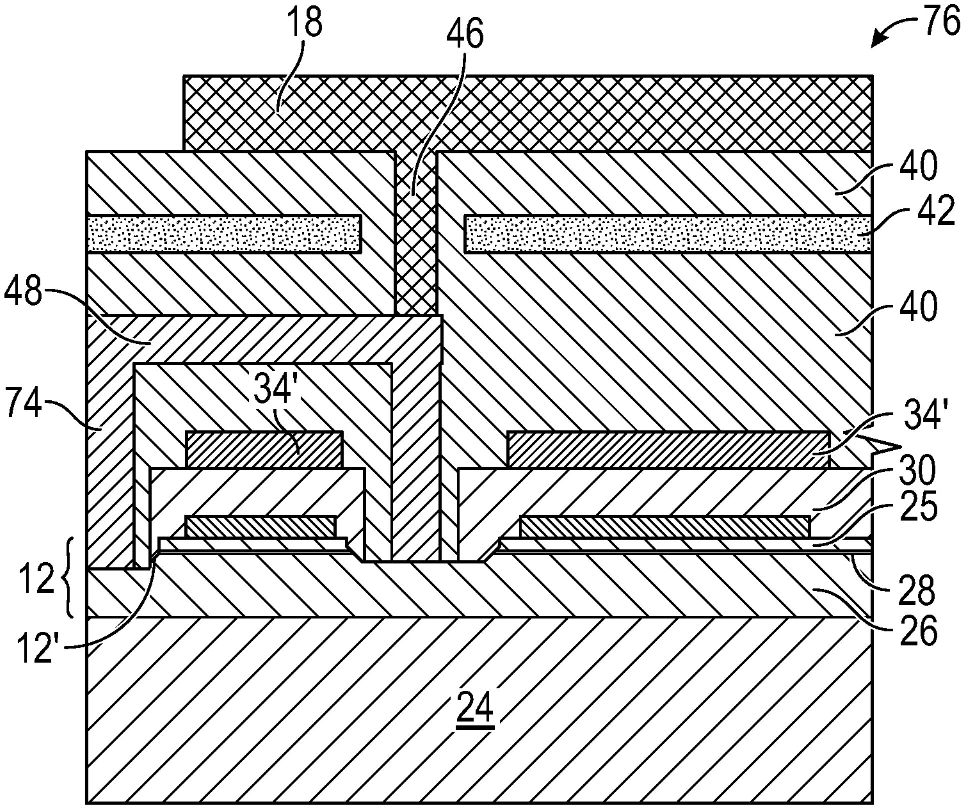
FIG. 14B is a cross-sectional view of the LED chip of FIG. 14A taken along the sectional line 14B-14B of FIG. 14A.
Figure 14C:
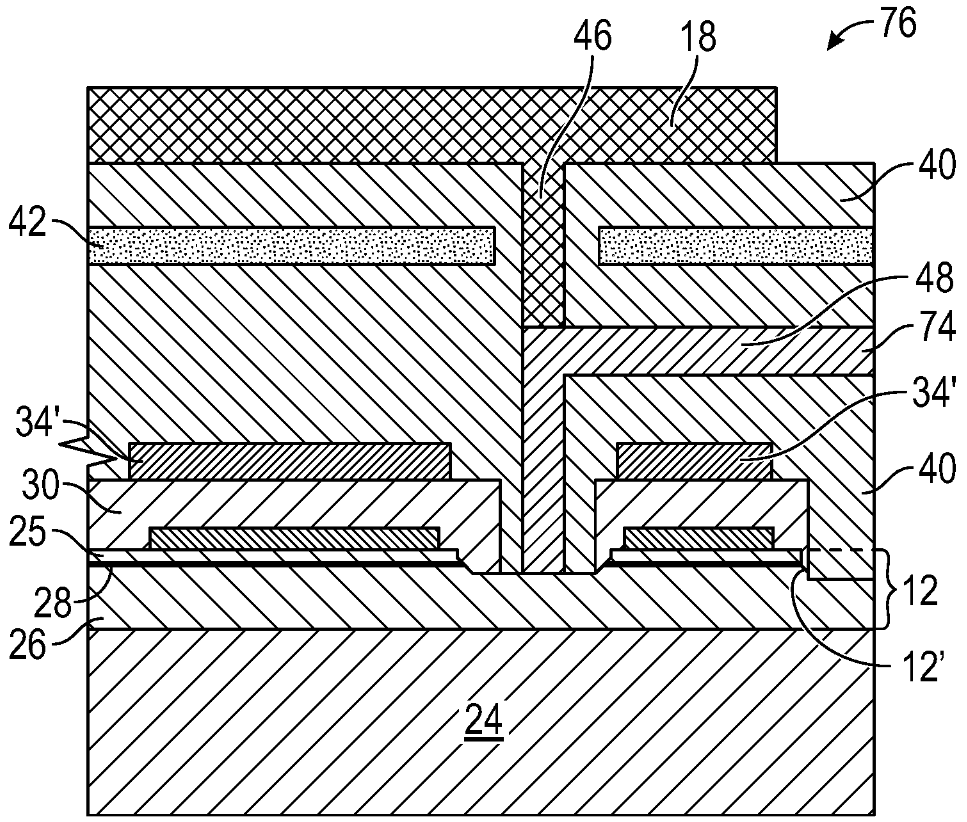
FIG. 14C is a cross-sectional view of the LED chip of FIG. 14A taken along the sectional line 14C-14C of FIG. 14A.

FIG. 14A is an exemplary top view of an LED chip 76 that is similar to the LED chip 72 of FIGS. 13A and 13B and further represents embodiments where electrical connections between the peripheral n-contact interconnect 74 and the n-type layer 26 are segmented along a perimeter of the LED chip 76. Rather than continuously contacting the n-type layer 26 outside the mesa sidewalls 12', portions of the passivation layer 40 may remain along the perimeter of the LED chip 76 between the peripheral n-contact interconnect 74 and the n-type layer 26, thereby forming a pattern of localized regions without direct contact. For illustrative purposes, the localized regions of the passivation layer 40 are shown as rectangular boxes along the perimeter of the LED chip 76. FIG. 14B is a cross-sectional view of the LED chip 76 of FIG. 14A taken along the sectional line 14B-14B of FIG. 14A that does not intersect with one of the portions of the passivation layer 40 that remains along the perimeter. As illustrated, the peripheral n-contact interconnect 74 extends to and makes electrical contact with the n-type layer 26. In contrast, FIG. 14C is a cross-sectional view of the LED chip 76 of FIG. 14A taken along the sectional line 14C-14C of FIG. 14A that does intersect with one of the portions of the passivation layer 40 that remains along the perimeter. Accordingly, in such regions, the passivation layer 40 remains between the peripheral n-contact interconnect 74 and the n-type layer 26. Such a structure may be provided to control an amount of direct contact and associated current injection provided along the perimeter of the LED chip between the peripheral n-contact interconnect 74 and the n-type layer 26. By reducing an amount of direct contact, localized current spreading and corresponding light emission may be tailored along perimeter portions of the LED chip 76.

Figure 15:
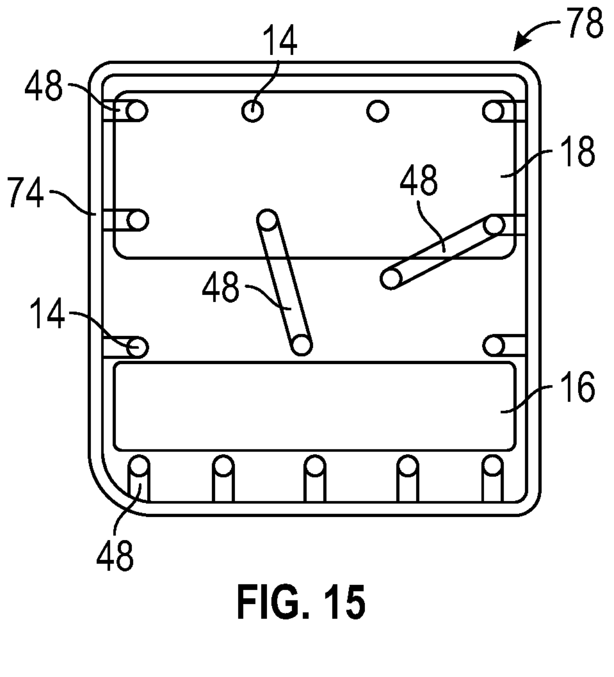
FIG. 15 is an exemplary top view of an LED chip that is similar to the LED chip of FIGS. 13A and 13B and includes an alternative arrangement where n-contact interconnects are not vertically registered below a p-contact.

FIG. 15 is an exemplary top view of an LED chip 78 that is similar to the LED chip 72 of FIGS. 13A and 13B and includes an alternative arrangement where n-contact interconnects 14 are not vertically registered below the p-contact 16. Accordingly, the principles described above for the peripheral n-contact interconnect 74 may not be limited to embodiments where the n-contact interconnects 14 are vertically registered with the p-contact 16. In this manner, the peripheral n-contact interconnect 74 may route electrically conductive paths between the n-contact 18 and n-contact interconnects 14 that are proximate or even surrounding the p-contact 16 without being directly between the p-contact 16 and the remainder of the LED chip 78. Such an arrangement may be beneficial for increasing an amount of electrically activated paths between the p-contact 16 and portions of the LED chip 78 that are vertically registered with the p-contact 16.

Figure 16:
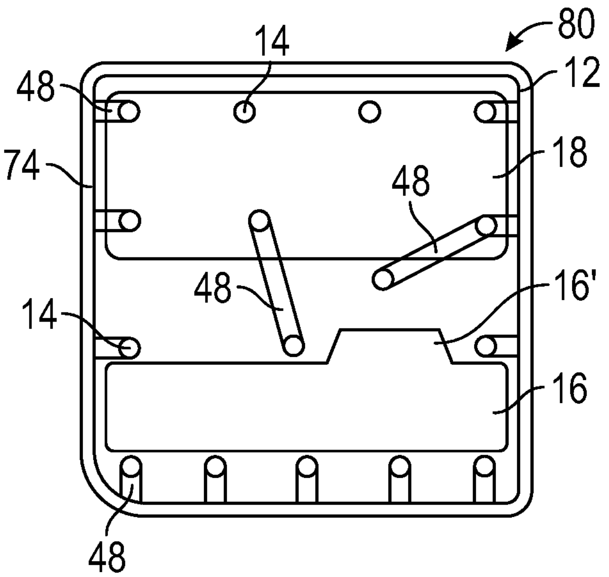
FIG. 16 is an exemplary top view of an LED chip that is similar to the LED chip of FIG. 15 and includes an arrangement where a p-contact covers more area of the LED chip.

FIG. 16 is an exemplary top view of an LED chip 80 that is similar to the LED chip 78 of FIG. 15 and includes an arrangement where the p-contact 16 covers more area of the LED chip 80. For embodiments where n-contact interconnects 14 are not vertically registered below the p-contact 16, the arrangement of the n-contact interconnects 14 and the n-contact structure 48 may be provided to still provide effective current spreading while also allowing a larger area for the p-contact 16. By way of example, the p-contact 16 may include a lateral protrusion 16' that extends toward the n-contact 18. FIG. 16 illustrates a particular arrangement of the n-contact structure 48 and the peripheral n-contact interconnect 74 that route electrically conductive paths between the n-contact 18 and various n-contact interconnects 14 that laterally surround the p-contact 16.

Figure 17A:
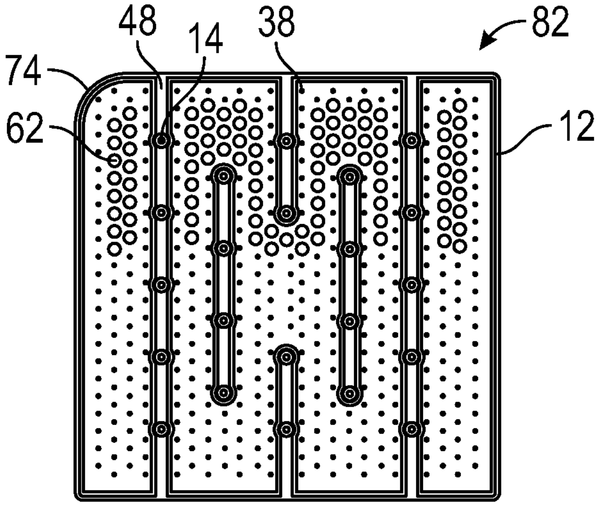
FIG. 17A is a top view of an LED chip that will have a segmented p-contact at a fabrication step after reflective layer interconnects, the n-contact interconnects, the n-contact structure, the peripheral n-contact interconnect, and openings, among other elements, have been formed.
Figure 17B:
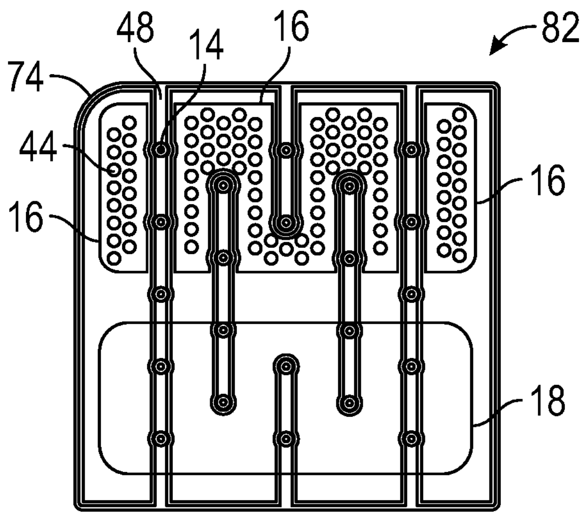
FIG. 17B is a top view of the LED chip of FIG. 17A at a subsequent fabrication step after the segmented p-contact, the p-contact vias, and the n-contact, among other elements, have been formed.

FIGS. 17A to 17C illustrate top views for a sequence of fabrication steps of an LED chip 82 that is similar to the LED chips 78 and 80 of FIGS. 15 and 16 and further includes an arrangement where the p-contact 16 is segmented in a discontinuous manner across the LED chip 82. The sequence of fabrication steps may represent various steps and it is understood intermediate fabrication steps may also be provided.

FIG. 17A is a top view of the LED chip 82 at a fabrication step after the reflective layer interconnects 38, the n-contact interconnects 14, the n-contact structure 48, the peripheral n-contact interconnect 74, and openings 62, among other elements, have been formed. As illustrated, the n-contact structure 48 may electrically couple linear arrangements of the n-contact interconnects 14 (e.g., columns or rows depending on the orientation). In this regard, the n-contact structure 48 may form a number of discontinuous segments that are each coupled to a separate grouping of the n-contact interconnects 14. Certain segments, or first segments, of the n-contact structure 48 may continuously extend from one edge to an opposing edge of the active LED structure 12 to electrically couple between portions of the peripheral n-contact interconnect 74 on the opposing edges. As used herein, the opposing edges of the active LED structure 12 may embody the mesa sidewalls 12' as illustrated, for example, in FIG. 13A. Other segments, or second segments, of the n-contact structure 48 may continuously extend in areas of the LED chip 82 that do not extend to one or more of the opposing edges. For example, in FIG. 17A, two such segments of the n-contact structure 48 are illustrated proximate a center of the LED chip 82. In this manner, one or more continuous portions of the active LED structure 12 may extend between certain ones of the segments of the n-contact structure 48. The openings 62 correspond with the fifth openings 62 as described and illustrated for FIG. 9A. Accordingly, the openings 62 define areas where the later-formed p-contact vias 44 will be formed.

FIG. 17B is a top view of the LED chip 82 of FIG. 17A at a subsequent fabrication step after the p-contact 16, the p-contact vias 44, and the n-contact 18, among other elements, have been formed. The p-contact vias 44 effectively fill the openings 62 of FIG. 17A to provide electrically conductive paths between the p-contact 16 and the underlying active LED structure 12 (i.e., the p-type layer). The p-contact 16 may be provided in discontinuous portions or segments relative to the n-contact structure 48 and the n-contact interconnects 14, thereby avoiding closely spaced metal layers having opposing polarities when electrically activated. By way of example, the LED chip 82 includes outer segments, or first discontinuous portions, of the p-contact 16 that are peripherally arranged between vertical boundaries of the segments of the n-contact structure 48 that continuously extend between opposing edges of the active LED structure 12 and other edges of the active LED structure 12. The LED chip 82 further includes a central segment of the p-contact 16, or a second discontinuous portion, that is continuous around the centrally located staggered segments of the n-contact structure 48. In this manner, the LED chip 82 may be arranged without n-contact interconnects 14 that are vertically registered with the p-contact 16 while also providing electrically conductive paths from the n-contact 18 that traverse areas of the active LED structure 12 that laterally surround each of the segments of the p-contact 16.

Figure 18:
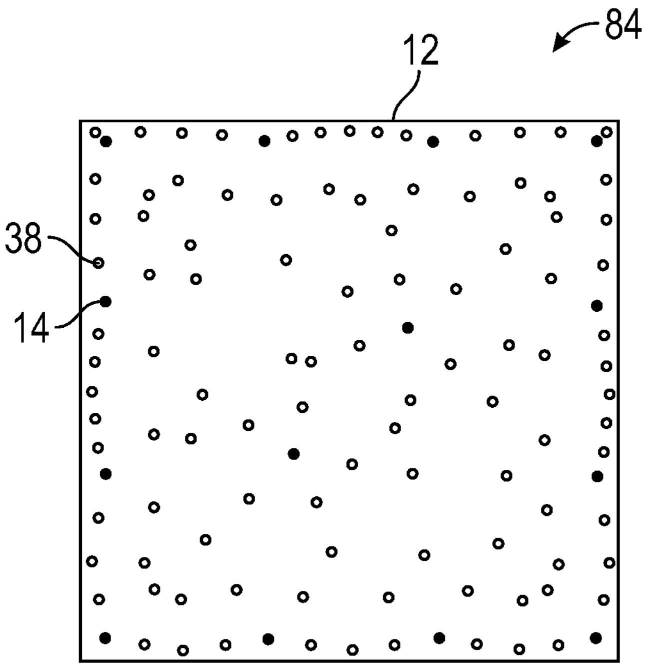
FIG. 18 is a top view of an LED chip with a pattern of n-contact interconnects and reflective layer interconnects according to principles disclosed herein.
Figure 19:
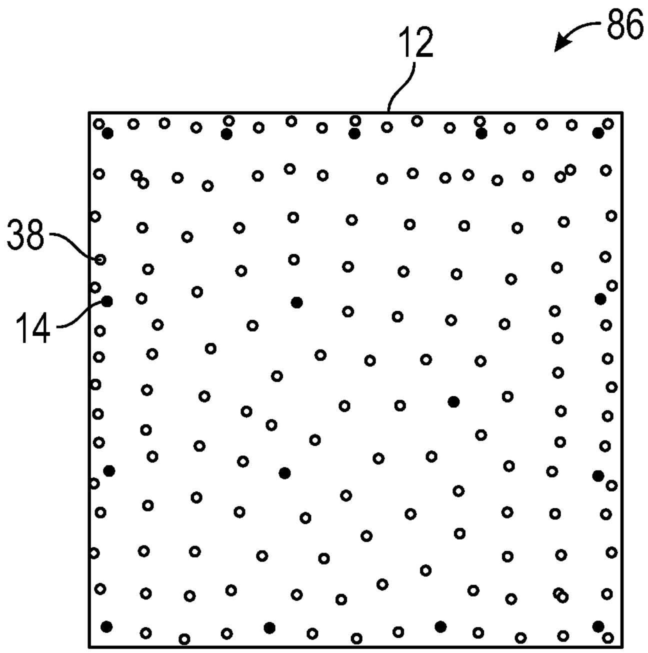
FIG. 19 is a top view of an LED chip that is similar to the LED chip of FIG. 18 and comprises higher densities of n-contact interconnects and reflective layer interconnects.
Figure 20:
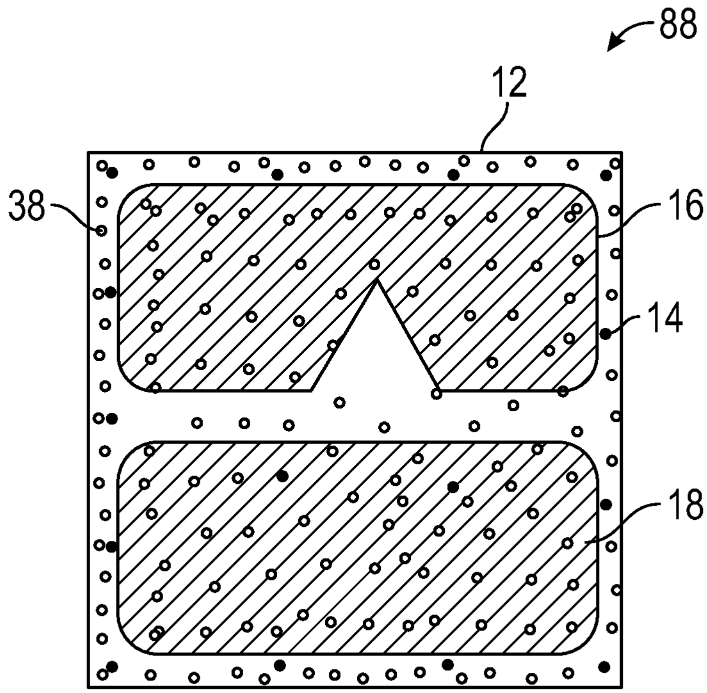
FIG. 20 is a top view of an LED chip that is similar to the LED chip of FIG. 18 except the n-contact interconnects are not registered between a boundary of the p-contact and the active LED structure.

As described herein, the principles of the present disclosure allow various configurations that effectively route n-contact and p-contact electrical connections across LED chips while reducing instances of electrical connections having opposing polarities being arranged too close to one another. The arrangements of contact structures and interconnect structures provide flexibility and control to tailor current spreading and/or injection for various LED chip structures and sizes. FIGS. 18 to 20 illustrate various arrangements of n-contact interconnects and reflective layer interconnects that may be provided with any of the previously described embodiments, including the LED chips illustrated in at least FIGS. 3-17B.

FIG. 18 is a top view of an LED chip 84 with a pattern of n-contact interconnects 14 and reflective layer interconnects 38 that may be implemented according to embodiments of the present disclosure. As illustrated, the reflective layer interconnects 38 and the n-contact interconnects 14 are provided with higher densities proximate peripheral edges of the LED chip 84 relative to central regions of the LED chip 84. Such an arrangement may be advantageous for larger area LED chips, such as edges that are greater than 0.5 μm, where current injection may be more challenging along the peripheral edges. By providing such increased densities of the reflective layer interconnects 38 and the n-contact interconnects 14, increased brightness along the peripheral edges and/or increased uniformity of brightness across the LED chip 84 may be realized.

FIG. 19 is a top view of an LED chip 86 that is similar to the LED chip 84 of FIG. 18 and comprises even higher densities of n-contact interconnects 14 and reflective layer interconnects 38. As illustrated, the density of n-contact interconnects 14 and reflective layer interconnects 38 at the peripheral edges of the LED chip 86 are higher than in FIG. 18. Additionally, the density of n-contact interconnects 14 and reflective layer interconnects 38 along central regions are also higher than the LED chip 84 of FIG. 18. In this manner, the LED chip 86 of FIG. 19 may be advantageous to enhance current spreading for larger chip areas with LED structures where current spreading is more challenging.

FIG. 20 is a top view of an LED chip 88 that is similar to the LED chip 84 of FIG. 18 except the n-contact interconnects 14 are not registered between a boundary of the p-contact 16 and the active LED structure 12. As illustrated, various ones of the n-contact interconnects 14 are arranged between edges of the p-contact 16 and edges of the active LED structure 12 that are closest to the p-contact 16. In this manner, electrical paths from the n-contact 18 may effectively cover large areas of the LED chip 88 while also avoiding instances of electrical connections having opposing polarities begin arranged too close to one another.

Figure 21:
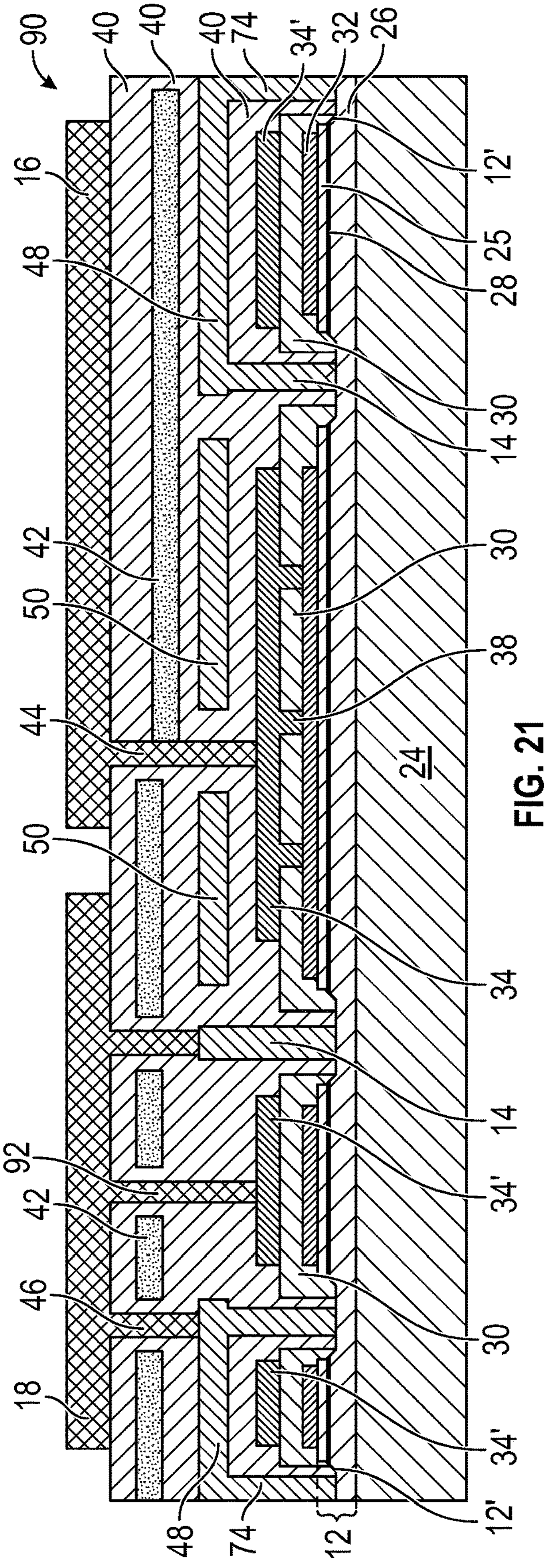
FIG. 21 is a cross-sectional view of a portion of an LED chip that is similar to the LED chip of FIG. 13A for embodiments where certain portions of the second reflective layer are electrically coupled with the n-contact.

FIG. 21 is a cross-sectional view of a portion of an LED chip 90 that is similar to the LED chip 72 of FIG. 13A for embodiments where certain ones of the portions 34' of the second reflective layer 34 are electrically coupled with the n-contact 18. For example, the portions 34' of the second reflective layer 34 that are between the n-contact 18 and the active LED structure 12 may be electrically coupled with the n-contact 18 by way of another n-contact via 92. One or more of the portions 34' of the second reflective layer 34 may be decoupled, or entirely separated from the current spreading layer 32, the p-type layer 25, and the remainder of the second reflective layer 34 by way of the passivation layer 40. As illustrated, the n-contact via 92 may extend through the passivation layer 40 and an opening in the first interlayer 42. By electrically coupling such portions 34' to the n-contact 18, additional electrically conductive material may be coupled with electrical connections between the n-contact 18 and the n-type layer 26, which may effectively reduce an associated electrical resistance.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:

an active LED structure comprising an n-type layer, a p-type layer, and an active layer arranged between the n-type layer and the p-type layer;

an n-contact electrically coupled with the n-type layer;

a p-contact electrically coupled with the p-type layer;

a plurality of n-contact interconnects electrically coupled between the n-type layer and the n-contact, wherein one or more n-contact interconnects of the plurality of n-contact interconnects are vertically arranged between the p-contact and the n-type layer; and a reflective structure on the active LED structure, wherein the reflective structure comprises a first reflective layer that is electrically insulating, a second reflective layer that is electrically conductive, and a plurality of reflective layer interconnects that extend through the first reflective layer to electrically couple first portions of the second reflective layer to the p-type layer, wherein second portions of the second reflective layer are discontinuous with the first portions of the second reflective layer such that the second portions of the second reflective layer are electrically isolated from the active LED structure.

2. The LED chip of claim 1, wherein the one or more n-contact interconnects of the plurality of n-contact interconnects are electrically coupled to an n-contact structure that is electrically coupled to the n-contact.

3. The LED chip of claim 2, wherein the n-contact structure is arranged to laterally extend from a position that is vertically registered with the n-contact to a position that is vertically registered with the p-contact such that the n-contact structure is electrically coupled with the one or more n-contact interconnects of the plurality of n-contact interconnects that are vertically arranged between the p-contact and the n-type layer.

4. The LED chip of claim 2, further comprising:

a peripheral n-contact interconnect that is electrically coupled to a portion of the n-type layer that is outside a mesa sidewall of the active LED structure, the mesa side wall comprising a sidewall of the p-type layer, the active layer, and a portion of the n-type layer;

wherein the n-contact structure is arranged to laterally extend from a position that is vertically registered with the n-contact to the mesa sidewall such that the n-contact structure is electrically coupled to the peripheral n-contact interconnect.

5. The LED chip of claim 4, wherein the peripheral n-contact interconnect is electrically coupled with the one or more n-contact interconnects of the plurality of n-contact interconnects that are vertically arranged between the p-contact and the n-type layer.

6. The LED chip of claim 4, wherein the peripheral n-contact interconnect is electrically coupled to the portion of the n-type layer that is outside the mesa sidewall in a continuous manner proximate two or more peripheral edges of the active LED structure.

7. The LED chip of claim 4, wherein the peripheral n-contact interconnect is electrically coupled to the portion of the n-type layer that is outside the mesa sidewall in a discontinuous manner such that portions of the peripheral n-contact interconnect contact the n-type layer and other portions of the peripheral n-contact interconnect are separated from the n-type layer by a passivation layer.

8. The LED chip of claim 2, wherein the second portions of the second reflective layer are vertically arranged between the n-contact structure and the active LED structure.

9. The LED chip of claim 1, wherein a second portion of the second reflective layer is entirely separated from the p-type layer by a passivation layer, and the second portion of the second reflective layer is electrically coupled with the n-contact.

10. The LED chip of claim 1, further comprising:

a passivation layer on the active LED structure, wherein the plurality of n-contact interconnects extend through portions of the passivation layer; and a first metal-containing interlayer, a second metal-containing interlayer, and a third metal-containing interlayer arranged within the passivation layer, wherein each of the first metal-containing interlayer, the second metal-containing interlayer, and the third metal-containing interlayer are electrically isolated from the n-contact and the p-contact.

11. The LED chip of claim 1, wherein the n-contact and the p-contact are contact pads arranged to receive external electrical connections when the LED chip is flip-chip mounted.

* * * * *